(12) United States Patent
Mittal et al.

(10) Patent No.: US 7,889,103 B2
(45) Date of Patent: Feb. 15, 2011

(54) METHOD AND APPARATUS FOR LOW COMPLEXITY COMBINATORIAL CODING OF SIGNALS

(75) Inventors: Udar Mittal, Hoffman Estates, IL (US); James P. Ashley, Naperville, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 189 days.

(21) Appl. No.: 12/047,586

(22) Filed: Mar. 13, 2008

(65) Prior Publication Data

US 2009/0231169 A1 Sep. 17, 2009

(51) Int. Cl.
  *H03M 7/00* (2006.01)
(52) U.S. Cl. .................... 341/107; 341/51; 341/58; 341/59; 341/65; 341/67; 375/240.22; 375/240.24; 375/262; 375/295; 382/104; 382/236; 382/253
(58) Field of Classification Search ........... 341/51, 341/58, 59, 65, 67, 106, 107; 375/240.12, 375/240.22, 240.24, 262, 295; 382/104, 382/236, 253
See application file for complete search history.

(56) References Cited

U.S. PATENT DOCUMENTS

| | | | | |
|---|---|---|---|---|
| 4,560,977 | A | * | 12/1985 | Murakami et al. ........... 341/118 |
| 4,670,851 | A | * | 6/1987 | Murakami et al. ........... 378/121 |
| 4,727,354 | A | * | 2/1988 | Lindsay ........................ 341/106 |
| 4,853,778 | A | * | 8/1989 | Tanaka ...................... 348/422.1 |
| 5,006,929 | A | * | 4/1991 | Barbero et al. .......... 375/240.24 |
| 5,067,152 | A | * | 11/1991 | Kisor et al. ............... 348/422.1 |
| 5,394,473 | A | | 2/1995 | Davidson |
| 6,236,960 | B1 | | 5/2001 | Peng et al. |
| 6,304,196 | B1 | * | 10/2001 | Copeland et al. ............... 341/58 |
| 6,504,877 | B1 | * | 1/2003 | Lee ............................. 375/265 |
| 6,658,383 | B2 | | 12/2003 | Koishida et al. |
| 6,662,154 | B2 | | 12/2003 | Mittal et al. |
| 6,940,431 | B2 | * | 9/2005 | Hayami ...................... 341/102 |
| 7,031,493 | B2 | | 4/2006 | Fletcher et al. |
| 7,130,796 | B2 | | 10/2006 | Tasaki |
| 7,180,796 | B2 | | 10/2006 | Tasaki |
| 7,161,507 | B2 | * | 1/2007 | Tomic .......................... 341/51 |
| 7,230,550 | B1 | | 6/2007 | Mittal et al. |
| 7,231,091 | B2 | * | 6/2007 | Keith ......................... 382/239 |

(Continued)

FOREIGN PATENT DOCUMENTS

EP  1483759  8/2004

(Continued)

OTHER PUBLICATIONS

Ramprashad, "High Quality Embedded Wideband Speech Coding Using an Inherently Layered Coding Paradigm," Proceedings of International Conference on Acoustics, Speech, and Signal Processing, ICASSP 2000, vol. 2, Jun. 5-9, 2000, pp. 1145-1148.

(Continued)

*Primary Examiner*—Linh V Nguyen

(57) ABSTRACT

To reduce the complexity of the encoding/decoding of pulse positions and/or pulse magnitudes associated with complex combinatorial computations, a method and structure for encoding and decoding of pulse position and/or pulse magnitudes requires fewer computations of these combinatorial functions. Adaptive switching between coding or encoding is performed in accordance with the estimated density of the plurality of occupied positions.

25 Claims, 9 Drawing Sheets

U.S. PATENT DOCUMENTS

| | | | |
|---|---|---|---|
| 7,414,549 B1 * | 8/2008 | Yang et al. | 341/50 |
| 7,461,106 B2 | 12/2008 | Mittal et al. | |
| 2003/0009325 A1 | 1/2003 | Kirchherr et al. | |
| 2004/0252768 A1 * | 12/2004 | Suzuki et al. | 375/240.24 |
| 2006/0173675 A1 | 8/2006 | Ojanpera | |
| 2006/0222374 A1 | 10/2006 | Gnauck et al. | |
| 2008/0065374 A1 | 3/2008 | Mittal et al. | |
| 2009/0024398 A1 | 1/2009 | Mittal et al. | |
| 2009/0100121 A1 | 4/2009 | Mittal et al. | |
| 2009/0112607 A1 | 4/2009 | Ashley et al. | |
| 2009/0234642 A1 | 9/2009 | Mittal et al. | |
| 2009/0259477 A1 | 10/2009 | Ashley et al. | |
| 2010/0169087 A1 | 7/2010 | Ashley et al. | |
| 2010/0169099 A1 | 7/2010 | Ashley et al. | |
| 2010/0169100 A1 | 7/2010 | Ashley et al. | |
| 2010/0169101 A1 | 7/2010 | Ashley et al. | |

FOREIGN PATENT DOCUMENTS

| | | |
|---|---|---|
| EP | 1533789 | 5/2005 |
| EP | 1619664 | 1/2006 |
| EP | 1818911 A1 | 8/2007 |
| EP | 1845519 | 10/2007 |
| EP | 1912206 A1 | 4/2008 |
| EP | 1959431 A1 | 8/2008 |
| WO | 9715983 | 5/1997 |
| WO | 03073741 A2 | 9/2003 |
| WO | 2007063910 A1 | 6/2007 |

OTHER PUBLICATIONS

Ramprashad, "A Two Stage Hybrid Embedded Speech/Audio Coding Structure," Proceedings of Internationnal Conference on Acoustics, Speech, and Signal Processing, ICASSP 1998, May 1998, vol. 1, pp. 337-340, Seattle, Washington.

International Telecommunication Union, "G.729.1, Series G: Transmission Systems and Media, Digital Systems and Networks, Digital Terminal Equipments—Coding of analogue signals by methods other than PCM,G.729 based Embedded Variable bit-rate coder: An 8-32 kbit/s scalable wideband coder bitstream interoperable with G.729," ITU-T Recomendation G.729.1, May 2006, Cover page, pp. 11-18. Full document available at: http://www.itu.int/rec/T-REC-G.729.1-200605-I/en.

Mittal et al., Coding unconstrained FCB excitation using combinatorial and Huffman codes, Speech Coding 2002 IEEE Workshop Proceedings, Oct. 1, 2002, pp. 129-131.

Ashley et al., Wideband coding of speech using a scalable pulse codebook, Speech Coding 2000 IEEE Workshop Proceedings, Sep. 1, 2000, pp. 148-150.

Mittal et al., Low complexity factorial pulse coding of MDCT coefficients using approximation of combinatorial functions, Acoustics, Speech and Signal Processing, 2007. ICASSP 2007. IEEE International Conference on, Apr. 1, 2007, pp. I-289-I-292.

Tancerel, L. et al., "Combined Speech and Audio Coding by Discrimination," In Proceedings of IEEE Workshop on Speech Coding, pp. 154-156, (2000).

3rd Generation Partnership Project, Technical Specification Group Service and System Aspects;Audio codec processing functions;Extended Adaptive Multi-Rate—Wideband (AMR-WB+) codec; Transcoding functions (Release 7), V7.0.0, Mar. 1, 2007.

Chan et al., "Frequency domain postfiltering for multiband excited linear predictive coding of speech", In Electronics Letters, pp. 1061-1063, Feb. 27, 1996.

Chen et al., "Adaptive postfiltering for quality enhancement of coded speech", In IEEE Transactions on Speech and Audio Processing, vol, 3, No. 1, pp. 59-71, Jan. 1, 1995.

Andersen et al., "Reverse water-filling in predictive encoding of speech", In 1999 IEEE Workshop on Speech Coding Proceedings, pp. 105-107, Jun. 20, 1999.

Makinen et al., "AMR-WB+: a new audio coding standard for 3rd generation mobile audio service", In 2005 Proceedings IEEE International Conference on Acoustics, Speech and Signal Processing, vol. 2, pp. ii/1109-ii/1112, Mar. 18, 2005.

Faller et al., "Technical advances in digital audio radio broadcasting", Proceedings of the IEEE, vol. 90, No. 8, pp. 1303-1333, Aug. 1, 2002.

Salami et al., "Extended AMR-WB for High-Quality Audio on Mobile Devices", IEEE Communications Magazine, pp. 90-97, May 1, 2006.

Hung et al., Error-resilient pyramid vector quantization for image compression, IEEE Transactions on Image Processing, vol. 7, No. 10, Oct. 1, 1998.

Markas T. et al.: "Multispectral image compression algorithms", Data Compression Conference, 1993, DCC '93, Snowbird, UT, USA Mar. 30-Apr. 2, 1993, Los Alamitos, CA, USA, IEEE Compt. Soc. US, Mar. 30, 1993, pp. 391-400.

"Enhanced Variable Rate Codec, Speech Service Options 3, 68, and 70 for Wideband Spread Spectrum Digital Systems", 3GPP2 TSG-C Working Group 2, XX, XX, No. C S0014-C, Jan. 1, 2007, pp. 1-5.

Boris Ya Ryabko et al.: "Fast and Efficient Construction of an Unbiased Random Sequence", IEEE Transactions on Information Theory, IEEE, US, vol. 46, No. 3, May 1, 2000, ISSN: 0018-9448, pp. 1090-1093.

Ratko V. Tomic: "Quantized Indexing: Background Information", May 16, 2006, URL: http://web.archive.org/web/20060516161324/www.1stworks.com/ref/TR/tr05-0625a.pdf, pp. 1-39.

Hung, et al, "Error Resilient Pyramid Vector Quantization for Image Compression." IEEE 1994 pp. 583-587, Computer Systems Laboratory, Stanford University, Stanford, CA, USA.

Cadel, et al, "Pyramid Vector Coding for High Quality Audio Compression", IEEE 1997, pp. 343-346, Cefriel, Milano, Italy and Alcatel Telecom, Vimercate, Italy.

Ashley, et al, "Wideband Coding of Speech Using a Scalable Pulse Codebook," IEEE 2000, pp. 148-150, Motorola Labs, Schaumburg, Illinois, USA.

U.S. Appl. No. 12/047,589, filed Mar. 13, 2008, in the name of UDAR MITTAL, entitled "Apparatus and Method for Low Complexity Combinatorial Coding of Signals".

Ramprashad, "Embedded Coding Using a Mixed Speech and Audio Coding Paradigm," International Journal of Speech Technology, Kluwer Academic Publishers, Netherlands, vol. 2, No. 4, May 1999, pp. 359-372.

Kovesi, et al., "A Scalable Speech and Adiuo Coding Scheme with Continuous Bitrate Flexibility," Proceedings of the IEEE International Conference on Acoutics, Speech and Signal Processing 2004 (ICASSP '04) Montreal, Quebec, Canada, May 17-21, 2004, vol. 1, pp. 273-276.

Kim et al.; "A New Bandwidth Scalable Wideband Speech/Audio Coder" Proceedings of Proceedings of International Conference on Acoustics, Speech, and Signal Processing, ICASSP; Orland, FL; ; vol. 1, May 13, 2002 pp. 657-660.

Ido Tal et al.: "On Row-by-Row Coding for 2-D Constraints", Information Theory, 2006 IEEE International Symposium On, IEEE, PI, Jul. 1, 2006, pp. 1204-1208.

Virette et al "Adaptive Time-Frequency Resolution in Modulated Transform at Reduced Delay" ICASSP 2008; pp. 3781-3784.

Edler "Coding Audio Signals with Overlapping Block Transform and Adaptive Window Functions"; Journal of Vibration and Low Voltage fnr; vol. 43, 1989, Section 3.1.

Princen et al., "Subband/Transform Coding Using Filter Bank Designs Based on Time Domain Aliasing Cancellation" IEEE 1987; pp. 2161-2164.

* cited by examiner

ENCODER

METHOD AND APPARATUS FOR LOW COMPLEXITY COMBINATORIAL CODING OF SIGNALS

BACKGROUND

Methods for coding vector or matrix quantities for speech, audio, image, video, and other signals are well known. One such method described in U.S. Pat. No. 6,236,960 by Peng, et. al, (which is incorporated by reference herein) is known as Factorial Pulse Coding (or FPC). FPC can code a vector $x_i$ using a total of M bits, given that:

$$m = \sum_{i=0}^{n-1} |x_i|, \quad (1)$$

and all values of vector $x_i$ are integral valued such that $-m \leq x_i \leq m$, where m is the total number of unit amplitude pulses, and n is the vector length. The total M bits are used to code N combinations in a maximally efficient manner, such that the following expression, which describes the theoretical minimum number of combinations, holds true:

$$N = \sum_{d=1}^{\min(m,n)} F(n,d)D(m,d)2^d \leq 2^M. \quad (2)$$

For this equation, F(n,d) are the number of combinations of d non-zero vector elements over n positions given by:

$$F(n,d) = \frac{n!}{d!(n-d)!}, \quad (3)$$

D(m,d) are the number of combinations of d non-zero vector elements given m total unit pulses given by:

$$D(m,d) = F(m-1, d-1), \quad (4)$$

and $2^d$ represents the combinations required to describe the polarity (sign) of the d non-zero vector elements. The term min(m, n) allows for the case where the number of unit magnitude pulses m exceeds the vector length n. A method and apparatus for coding and decoding vectors of this form have been fully described in the prior art. Furthermore, a practical implementation of this coding method has been described in 3GPP2 standard C.S0014-B, where the vector length n=54 and the number of unit magnitude pulses m=7 produce an M=35 bit codeword. While these values of n and m do not cause any unreasonable complexity burden, larger values can quickly cause problems, especially in mobile handheld devices which need to keep memory and computational complexity as low as possible. For example, use of this coding method for some applications (such as audio coding) may require n=144 and m=28, or higher. Under these circumstances, the cost associated with producing the combinatorial expression F(n,d) using prior art methods may be too high for practical implementation.

In looking at this cost in greater detail, we can rewrite Eq. 3 as:

$$F(n,d) = \frac{\prod_{i=n-d+1}^{n} (i)}{\prod_{j=1}^{d} (j)}. \quad (5)$$

Direct implementation is problematic because F(144, 28) would require 197 bits of precision in the numerator and 98 bits of precision in the nominator to produce a 99 bit quotient. Since most digital signal processors (DSPs) used in today's handheld devices typically support only 16 bit×16 bit multiply operations, special multi-precision multiply/divide routines would need to be employed. Such routines require a series of nested multiply/accumulate operations that typically require on the order of k multiple/accumulate (MAC) operations, where k is the number of 16 bit segments in the operand. For a 197 bit operand, k=⌈197/16⌉=13. So, execution of a single 197×16 bit multiply would require a minimum of 13 MAC operations plus shifting and store operations. The denominator term is calculated in a similar manner to produce a 98 bit result. In addition, a 197/98 bit division is required, which is an extremely complex operation, thus computation of the entire factorial relation in Eq. 5 would require considerable resources.

In an effort to reduce complexity, Eq. 5 can be rewritten to distribute the divide operations to produce the following:

$$F(n,d) = \text{round}\left[\left(\frac{n}{d}\right) \cdot \left(\frac{n-1}{d-1}\right) \cdot \left(\frac{n-2}{d-2}\right) \cdots \left(\frac{n-d+2}{2}\right) \cdot \left(\frac{n-d+1}{1}\right)\right] \quad (6)$$

In this expression, the dynamic range of the divide operations is reduced, but unfortunately, increased resolution of the quotient is needed to accurately represent division by 3, 7, 9, etc. In order to accommodate this structure, a rounding operation is also needed to guarantee an integer result. Given the large number of high precision divide operations, this implementation does not adequately address the complexity problem for large m and n, and further has the potential to produce an incorrect result due to accumulated errors in precision.

In yet another implementation, Eq. 5 can be rearranged in the following manner:

$$F(n,d) = \quad (7)$$
$$n \cdot (n-1) \cdot \left(\frac{1}{2}\right) \cdot (n-2) \cdot \left(\frac{1}{3}\right) \cdots (n-d+2) \cdot \left(\frac{1}{d-1}\right) \cdot (n+d+1) \cdot \left(\frac{1}{d}\right).$$

If this expression is evaluated from left to right, the result will always produce an integer value. While this method controls the precision and dynamic range issue to some degree, large values of m and n still require extensive use of multi-precision multiply and divide operations.

Finally, in order to minimize computational complexity, it may be possible to pre-compute and store all factorial combinations in a lookup table. Thus, all values of F(n,m) may be simply stored in an n×m matrix and appropriately retrieved from memory using very few processor cycles. The problem with this approach, however, is that as n and m become large, so does the associated memory requirement. Citing the previous example, F(144, 28) would require 144×28×⌈99 bits/8 bits/byte⌉=52,416 bytes of storage, which is unreasonable for most mobile handheld devices. Therefore, a need exists for a method and apparatus for low-complexity combinational Factorial Pulse Coding of vectors.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

Figure 1:
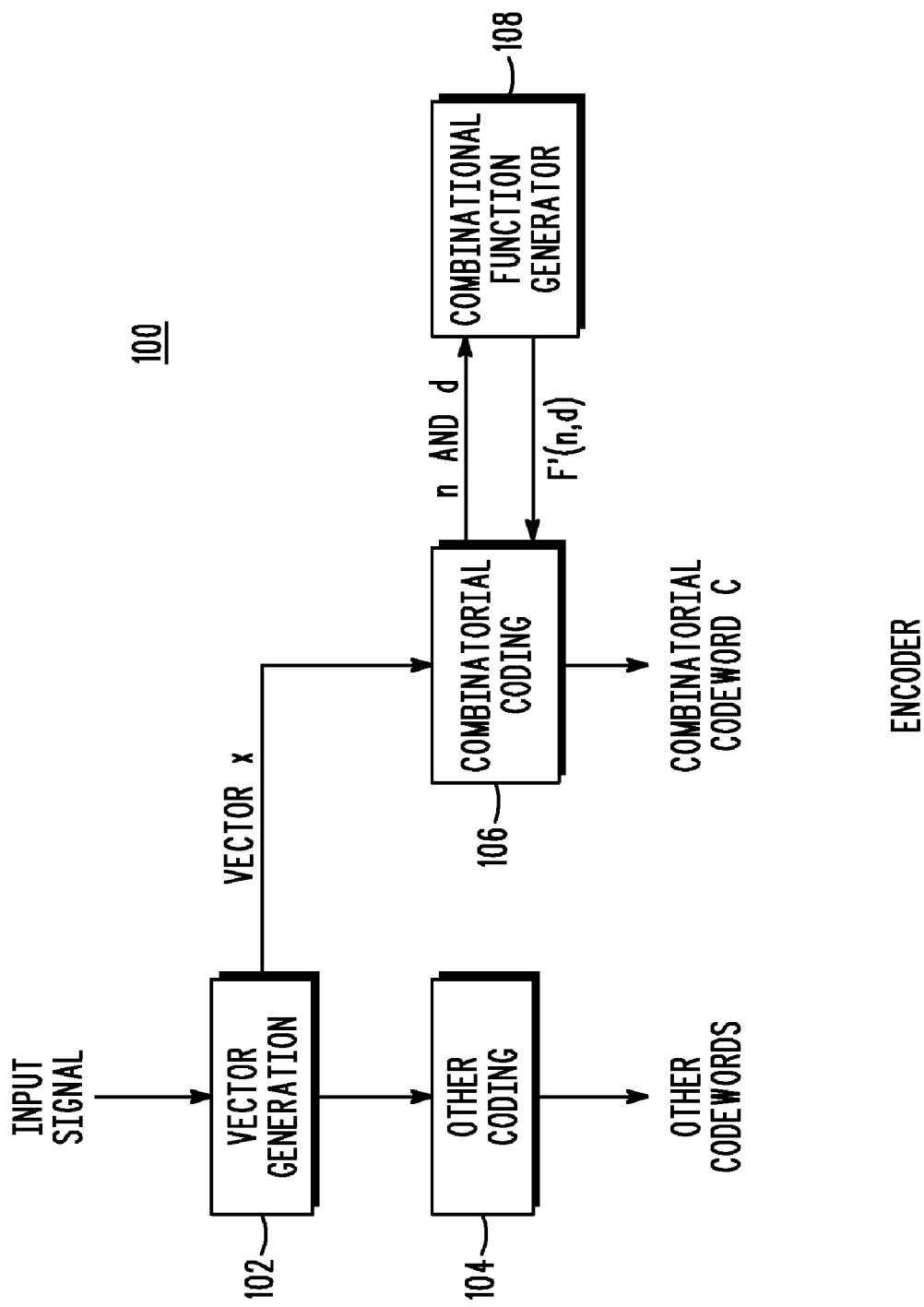
FIG. 1 is a block diagram of an encoder.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The present invention relates generally to coding vectors and in particular, to combinational Factorial Pulse Coding of vectors.

Turning now to the drawings, wherein like numerals designate like components, FIG. 1 is a block diagram of encoder 100. Encoder 100 comprises vector generator 102, combinational coding circuitry (coder) 106, combination function generator 108, and other coding circuitry 104. During operation, an input signal to be coded is received by vector generator 102. As is known in the art, the input signal may comprise such signals as speech, audio, image, video, and other signals.

Vector generator 102 receives the input signal and creates vector $x_i$. Vector generator 102 may comprise any number of encoding paradigms including, but not limited to, Code-Excited Linear Prediction (CELP) speech coding as described by Peng, et. al, transform domain coding for audio, images and video including Discrete Fourier Transform (DFT), Discrete Cosine Transform (DCT), and Modified Discrete Cosine Transform (MDCT) based methods, wavelet based transform coding, direct time domain pulse code modulation (PCM), differential PCM, adaptive differential PCM (AD-PCM), or any one of a family of sub-band coding techniques that are well known in the art. Virtually any signal vector of the form given above may be advantageously processed in accordance with certain embodiments of the present invention.

Combinatorial coding circuitry 106 receives vector $x_i$ and uses Factorial Pulse Coding to produce a codeword C. As discussed above Factorial Pulse Coding can code a vector $x_i$ using a total of M bits, given that $m=\Sigma_{i=0}^{n-1}|x_i|$, and all values of vector $x_i$ are integral valued such that $-m \leq x_i \leq m$, where m is the total number of unit amplitude pulses, and n is the vector length. As discussed above, larger values of m and n can quickly cause problems, especially in mobile handheld devices which need to keep memory and computational complexity as low as possible.

In order to address this issue, combinatorial function generator 108 utilizes a low complexity technique for producing F'(n,d). Combinatorial coding circuitry 106 then utilizes F'(n, d) to produce codeword C. Circuitry 108 utilizes relatively low resolution approximations (bits of precision) of factorial combinations F'(n,d), which provide only enough precision to allow a valid codeword to be generated. That is, as long as certain properties are maintained, a suitable approximation of the function F(n, d) is sufficient to guarantee that the resulting codeword is uniquely decodable.

In order to describe the generation of F'(n,d), let us proceed by first deriving a function F'(n,d) that is a suitable approximation of F(n, d). The first step is to take the logarithm of an arbitrary base a of Eq. 5, and taking the inverse log base a of the rearranged terms:

$$F(n,d) = \exp_a\left(\sum_{i=n-d+1}^{n} \log_a(i) - \sum_{j=1}^{d} \log_a(j)\right), \quad (8)$$

where the function $\exp_a(k)=a^k$. Next, define functions P(i), Q(d), and R(k), and substitute into Eq. 8 such that:

$$F(n, d) = R\left(\sum_{i=n-d+1}^{n} P(i) - Q(d)\right), \quad (9)$$

where $P(i)=\log_a(i)$, $Q(d)=\sum_{j=1}^{d}\log_a(j)$, and $R(k)=\exp_a(k)=a^k$.

However, in accordance with an exemplary embodiment of the present invention, it is not necessary for F(n, d) and F'(n, d) to be equivalent in order for the resulting codeword to be uniquely decodable. There are only two conditions that are sufficient for this to hold true:

$$F'(n,d) \geq F(n,d), \quad (10)$$

and $$F'(n,d) \geq F'(n-1,d) + F'(n-1,d-1) \quad (11)$$

For the first condition, the restriction simply says that if F'(n,d)<F(n,d), then there will be overlapping code-spaces, and subsequently, there will be more than one input capable of generating a particular codeword; thus, the codeword is not uniquely decodable. The second condition states that the "error" for a given n, d shall be greater than or equal to the sum of the error terms associated with the previous element of the recursive relationship described by Peng, et. al in U.S. Pat. No. 6,236,960. It can be shown that F(n,d)=F(n−1,d)+F(n−1, d−1), which is only true if the combinatorial expression is exactly equal to $F(n,d)=C_d^n=n!/d!(n-d)!$. However, while the inequality in Eq. 11 is sufficient, it may not necessarily be true for all values of n and d. For such values, F(n,d) may satisfy another inequality derived from Eq. 31 of Peng, et al. and is given by:

$$F(n, d) > \sum_{i=1}^{d} F(n-(d-i+1), i). \quad (12)$$

In this case, Eq. 11 has to be satisfied with strict inequality for certain (m,k), (m≤n), (k≤d), that is:

$$F(m,k) > F(m-1,k) + F(m-1,k-1), m \leq n, k \leq d. \quad (13)$$

Referring back to Eq. 9, we now wish to generate F'(n, d) by creating the functions P'(i), Q'(d), and R'(k), with low complexity approximations of the original functions such that:

$$F'(n, d) = R'\left(\sum_{i=n-d+1}^{n} P'(i) - Q'(d)\right), \quad (14)$$

and where the conditions given in Eqs. 10 and 11 are satisfied. Considering P(i), we may wish to approximate the function such that $P'(i) \geq \log_a(i)$, i∈[1, 2, . . . , n]. If we choose a=2 and then restrict P'(i) to 32 bits of precision, the resulting operations are easy to implement on a handheld mobile device since most DSPs support single cycle 32 bit additions. Therefore, we define:

$$P'(i)=2^{-l(i)}\lfloor 2^{l(i)}\log_2(i)+1\rfloor, i\in[1, 2, \ldots, n], \quad (15)$$

where l(i) is a shift factor that may vary as a function of i. In the preferred embodiment, l(i)=l=21, but many other sets of values are possible. For this example, the $2^l$ factor is equivalent to a shift of l bits to the left, whereby the floor function $\lfloor x+1 \rfloor$ removes the fractional bits while rounding up to the next highest integer, and finally the $2^{-l}$ factor shifts the results back to the right by l bits. Using this methodology, the function $P'(i) \geq \log_2(i)$ for all i≥1, and also provides sufficient dynamic range and precision using only 32 bits because 9 bits of positive integer resolution in the $\log_2$ domain can represent a 512 bit number. To avoid the complexity of computing these values in real-time, they can be pre-computed and stored in a table using only 144×4 bytes of memory for the F(144, 28) example. Using a similar methodology for approximating Q(d), we get:

$$Q'(d) = \begin{cases} 0, & d = 1 \\ \sum_{j=2}^{d} 2^{-l(j)}\lfloor 2^{l(j)}\log_2(j)-1\rfloor, & d \in [2, \ldots, m] \end{cases}, \quad (16)$$

where the floor function $\lfloor x-1 \rfloor$ is used because of the subtraction of the quantity from the total. This guarantees that $Q'(d) \leq \sum_{j=1}^{d}\log_2(j)$ so that the contribution of Q'(d) will guarantee F'(n,d)≥F(n,d). While l/(j) can assume many values depending on the configuration of m and n, the preferred embodiment uses a value of l/(j)=l=14 for the variable shift factor. Like P'(i), Q'(d) can be pre-computed and stored in a table using only 28×4 bytes of memory for the F(144, 28) example. For defining R'(k), we need to first define k as:

$$k = \sum_{i=n-d+1}^{n} P'(i) - Q'(d). \quad (17)$$

With P'(i) and Q'(d) defined above, k is preferably a 32 bit number with an 8 bit unsigned integer component $k_i$ and a 24 bit fractional component $k_f$. Using this, we may derive $R'(k) \geq \exp_2(k)=2^k$ by letting $k=k_i+k_f$ and then taking the inverse logarithm base 2 to yield $2^k=2^{k_i}2^{k_f}$. We may then use a Taylor series expansion to estimate the fractional component to the desired precision, represented by $K_f=2^{k_f}$, rounding up the result using the ceiling function, and then appropriately shifting the result to form a multi-precision result (with only l significant bits), such that:

$$R'(k)=2^{k_i-l}\lceil 2^l K_f \rceil, \quad (18)$$

where $2^{k_i}$ is the integer shift factor applied to the Taylor series expansion result. Here, l is a shift factor used in a similar manner to Eqs. 15 and 16 to guarantee $R'(k) \geq 2^k$. However, since R'(k) cannot be practically pre-computed for efficient real-time operation, great care must be taken in specifying the exact operations necessary in both the encoder and decoder to ensure that the reconstructed signal vector matches the input signal vector exactly. Note that R'(k) may be obtained from left shifting $\lceil 2^l K_f \rceil$, which can be accurately represented by l bits.

In the above discussion, functions P'(i), Q'(d), and R'(k) have been chosen such that each individual function estimate guarantees that the resulting F'(n,d)≥F(n,d). However, it is only necessary for the aggregate effect to satisfy this condition. For example, P'(i) and Q'(d) may be as described above, but R'(k) may be a more conventional $R'(k) \approx 2^k$ function which may truncate or round the least significant bits such that R'(k) may be less than $2^k$ for some values of k. This is acceptable as long as this effect is small relative to the effects of P'(i) and Q'(d), so the properties in Eqs. 10 and 11 still hold true.

Also, any functions P'(i), Q'(d), and R'(k) may be used without loss of generality as long as the properties on Eqs. 10 and 11 are satisfied. Care must be taken however, that an increase in bit rate may occur if too little precision is used. It should also be noted that there is an inherent tradeoff in bit rate and complexity, and for large values of m, n, an increase of 1 or 2 bits may be a reasonable tradeoff for a significant reduction in complexity.

The formulation of the partial codeword C, for position and magnitudes, in combinatorial coding circuitry 106 is now described. Let $\pi=\{p_1, p_2, \ldots, p_v\}$ be the non-zero pulse positions (in increasing order) and $\mu=\{m_1, m_2, \ldots, m_v\}$ be the magnitudes at respective positions within a vector x. The code for pulse positions is given by:

$$C_\pi = \sum_{k=1}^{v} F(p_k, k) \quad 0 \le p_k < n, \quad (19)$$

and the code for pulse magnitudes is given by:

$$C_\mu = \sum_{k=1}^{v-1} F\left(\sum_{j=1}^{k} m_j - 1, k\right) \quad 1 \le \sum_{j=1}^{k} m_j, m_k < m. \quad (20)$$

Thus, the formulation of these codeword requires addition of v and v−1 multi-precision numbers. Similar subtraction operations are needed in the decoder. These operations also add to the complexity of the FPC method when n and m are large.

Consider encoding/decoding of an audio signal for a multi-layer embedded coding system. This technique is used for encoding the transform of the residual error signal in the three layers of the multi-layer system. Let the size of a 20 ms block is n=280 and is the same for all the layers. The number of the pulses for encoding depends on the bit-rate of each layer. If each layer is 8 kbps, 16 kbps, or 32 kbps then they need 160 bits, 320 bits, and 640 bits for coding of 20 ms block, respectively. Using the FPC technique a block of length 280 can be coded using 28, 74, and 230 pulses for 160 bits, 320 bits, and 640 bits per layer, respectively. The multi-precision operations in equations (19) and (20) are performed on a digital signal processor which typically operates on 16-bit words. Thus, for formation of 160 bit codeword, addition operations are needed to be performed over 10 words and for 640 bit codeword the addition operation are to be performed over 40 words. Each addition operation takes 4 units (generation of carry, move to array, add with carry). Hence encoding/decoding of k-bit codeword in p-layers of a multi-layer system requires $400 \cdot p \cdot \lceil k/16 \rceil \cdot (2m-3)$ operations/sec. For various values of n, m, and p the complexity of the multi-precision addition/subtraction operations is shown in Table 1. In this table, WMOPS stands for Weighted Millions of Operation Per Second.

TABLE 1

Complexity of addition/subtraction in the FPC Encoding/Decoding using a Prior Art Method

| Number of Layers (p) | Block Size (n) | Layer Bit Rate/Bits per 20 ms block (k) | Number of Pulses (m) | Complexity of Multi-precision addition/subtraction |
|---|---|---|---|---|
| 3 | 280 | 8 kbps/160 | 28 | 0.64 WMOPs |
| 3 | 280 | 16 kbps/320 | 74 | 3.48 WMOPs |
| 3 | 280 | 32 bbps/640 | 230 | 22.0 WMOPs |

From Table 1, we note that when the bit rate doubles, the complexity of the multi-precision addition increases six times.

As mentioned before, the combinatorial function is replaced by an approximate function F'(n,r) which is given as:

$$F'(n, r) = R\left(\sum_{i=n-r+1}^{n} P'(i) - Q'(r)\right), \quad (21)$$

where $$Q'(r) = \begin{cases} 0, & r = 1 \\ \sum_{j=2}^{r} 2^{-l_Q} \lfloor 2^{l_Q} \log_2(j) - 1 \rfloor, & r > 1, \end{cases} \quad (22)$$

and R'(k) is an approximation of the function $R'(k) \approx 2^k$, given as:

$$R'(k) = \lfloor 2^{k_I} \cdot R \lfloor 2^{l_R} K_f \rfloor \rfloor, \quad (23)$$

where $k=k_I+k_f$ is broken down into integer and fractional components of k, and $K_f=2^{k_f}$ is a low resolution Taylor series expansion of the fractional component of k. Based on the above pre-defined functions Q'(r) and R'(k), P'(i) are first obtained so that the unique decodability inequality $$F'(n,d) > F'(n-1,d) + F'(n-1,d-1) \quad (24)$$

is satisfied for all values of n and d.

Going back to equations (19) and (20), replacing approximate functions F' in place of actual functions F yields:

$$C_\pi = \sum_{k=1}^{v} F'(p_k, k) \quad 0 \le p_k < n, \quad (25)$$

$$C_\mu = \sum_{k=1}^{v-1} F'\left(\sum_{j=1}^{k} m_j - 1, k\right) \quad 1 \le \sum_{j=1}^{k} m_j, m_k < m. \quad (26)$$

Encoding of Number of Non-Zero Positions:

The $l_R$-bit mantissa and exponent representation format also have advantages in coding of the number of non-zero positions. The encoding of the number of number of non-zero positions v is given by $$C_v = \sum_{k=v+1}^{n} F'(n,k)F'(m-1,k-1)2^k \qquad (27)$$

It can be easily seen that the multiplication of two approximate functions can be much easier in the mantissa and exponent format than in the multi-precision format. The main advantage however is when we want to reduce the complexity then using the $l_R$-bit mantissa and exponent representation, each of the F'(n,k) and F'(m−1,k−1) can be pre-stores using only two words (product of their $l_R$-bit mantissa and sum of their exponent can also be pre-stored). This enables faster encoding of v without any significant ROM requirement.

Figure 2:
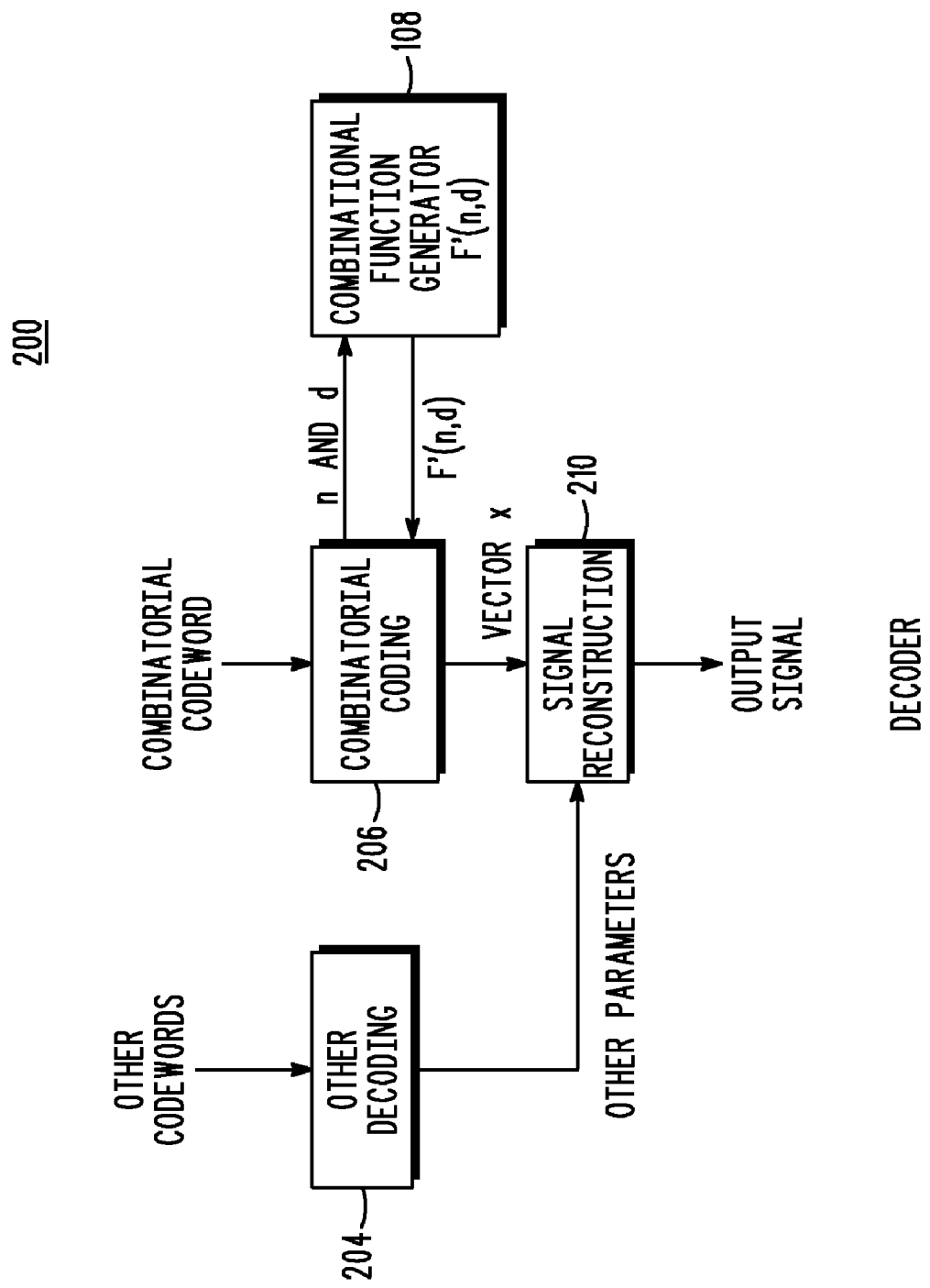
FIG. 2 is a block diagram of a decoder.

FIG. 2 is a block diagram of decoder 200. As shown, decoder 200 comprises combinatorial decoding circuitry 206, signal reconstruction circuitry 210, other decoding circuitry 204, and combinatorial function generator 108. During operation a combinatorial codeword is received by combinatorial decoding circuitry 206. Combinatorial decoding circuitry 206 provides n and d to combinatorial function generator, and receives F'(n,d) in response. Decoding circuitry 302 then creates vector $x_i$ based on F'(n,d). Circuitry 206 operates in a similar manner as circuitry 106, except subtraction replaces addition operations. In other words, $\Psi'_k = \Psi'_{k+1} - F'(p_k, k)$. Vector $x_i$ is passed to signal reconstruction circuitry 210 where the output signal (e.g., speech, audio, image, video, or other signals) is created based on $x_i$ and other parameters from other decoding circuitry 204. More specifically, the other parameters may include any number of signal reconstruction parameters associated with the signal coding paradigm being used in a particular embodiment. These may include, but are not limited to, signal scaling and energy parameters, and spectral shaping and/or synthesis filter parameters. Normally these parameters are used to scale the energy of and/or spectrally shape the reconstructed signal vector $x_i$ in such a manner as to reproduce the final output signal.

Figure 3:
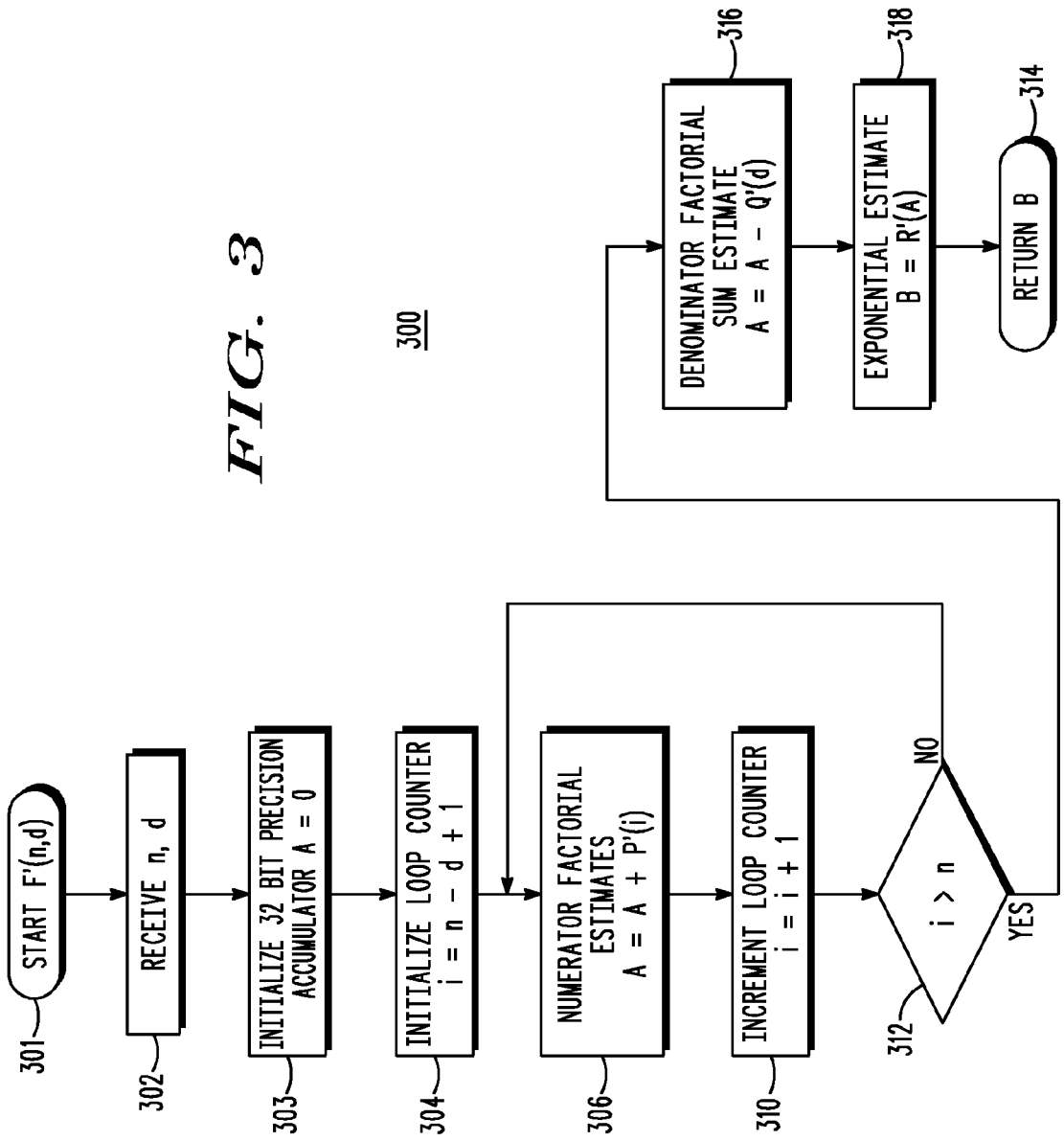
FIG. 3 is a flow chart showing operation of a combinatorial function generator of FIG. 1 and FIG. 3.

FIG. 3 is a flow chart showing operation of a combinatorial function generator of FIG. 1 and FIG. 3. More particularly, the logic flow 300 of FIG. 3 shows those steps for combinatorial function generator 108 to produce F'(n,d). The logic flow begins at 301, 302 where the inputs n and d are received. At 303 accumulator A is set to 0. At 304 the counter i is set equal to n−d+1. At 306 logarithm approximation P'(i) is added to the accumulator A. At 310 counter i is incremented by 1. 306 and 310 are repeated in a loop until the counter i is greater than n. 312 tests i>n and terminates the loop when i becomes greater than n. At this stage the accumulator contains the logarithm approximate of the numerator of the combinatorial function F(n, d). A logarithm approximation of the denominator of the combinatorial function Q'(d) is subtracted from the accumulator at 316 to obtain a logarithm approximation of the combinatorial function. At 318 an exponential approximation R'(A) of the accumulator is taken to generate the approximation B of the combinatorial function. At 314, B is outputted as F'(n, d).

While use of the reduced complexity combinatorial computation described above serves to reduce the complexity significantly, the computation of these functions still contribute greatly to the complexity of encoding and decoding methods. To address this, certain embodiments of the present invention provide for adaptively switching between methods of encoding and decoding of pulse positions and/or pulse magnitudes in order to decrease the number of times that computation of the combinatorial function must be performed.

Referring again to equations (19) and (20), as well as to their corresponding reduced-complexity implementation equations (25), and (26), note that the encoding process in equation (19), and equation (25) require v computations of combinatorial functions F and F', respectively. Similarly, equations (20) and (26) require v−1 computations of these functions. The decoding of pulse positions and pulse magnitude is iterative and hence the number of times these functions are computed is typically much higher. In the decoder, the number of computations of these functions increases linearly with the number of non-zero positions or occupied positions v. To reduce the complexity of the encoding/decoding of pulse positions and/or pulse magnitudes, certain alternate embodiments of the invention provide a method for encoding and decoding of pulse position and/or pulse magnitudes that requires lesser numbers of computations of these combinatorial functions. In these alternate embodiments, we propose modification to equations (19) and (20), and by extension, modification to equations (25) and (26), to selectively code the unoccupied positions.

Refer first to equation (20) and the corresponding reduced complexity equation (26). If we define $$p'_k = \sum_{j=1}^{k} m_j - 1 \qquad (28)$$

then equation (20) can be rewritten as:

$$C_\mu = \sum_{k=1}^{v-1} F(p'_k, k) \quad 0 \le p'_k < m-1 \qquad (20a)$$

And equation (26) can be rewritten as:

$$C_\mu = \sum_{k=1}^{v-1} F'(p'_k, k) \quad 0 \le p'_k < m-1 \qquad (26a)$$

Note that the equations (20a) and (26a) are similar in structure to equations (19) and (25), respectively, with $p_k$ replaced by $p'_k$, n replaced by m−1, and occupied positions v replaced by v−1, i.e., the encoding of pulse magnitudes can be viewed as position encoding of v−1 pulses placed in m−1 locations, where the occupied positions are identified by $p'_k$. In effect, encoding pulse magnitudes may be viewed as the magnitudes $m_j$ of occupied pulses being converted to generate pseudo positions defined by terms $p_j$ and $u_j$. Thus, any modification in the method of coding of pulse positions can be easily extended to coding of pulse magnitudes and vice-versa.

In accordance with certain of the alternate embodiments, then, we propose optimization of coding of pulse magnitudes and/or pulse positions to reduce the number of required computations of combinatorial functions. Before the encoding/decoding of the pulse positions, v is encoded/decoded (equation 27). Hence, if two times the number of non-zero positions is greater than the number of locations, i.e., 2·v>n, then the number of unoccupied positions $u_1, u_2, \ldots, u_v$ are less than the number of occupied positions v. Thus, in such cases encoding/decoding of the unoccupied positions using an equation similar to equation (19) (or (25)) will result in fewer computations of the combinatorial functions and hence will have lower complexity. To illustrate this mathematically, let us first define $u_k$ as the unoccupied positions, and U be the set of unoccupied positions, i.e., $$U=\{0, 1, \ldots, n-1\}-\{p_1, p_2, \ldots, p_v\}. \quad (29)$$

Note that the size of U is n−v. Now, whenever 2·v>n the code for position is now computed as $$C_\pi = \sum_{k=1}^{n-v} F(u_k, k) \; 0 \le u_k < n \text{ or} \quad (19z)$$

$$C_\pi = \sum_{k=1}^{n-v} F'(u_k, k) \; 0 \le u_k < n. \quad (25z)$$

Similarly for coding of magnitudes if 2·(v−1)>(m−1), then $$C_\mu = \sum_{k=1}^{m-v} F(u'_k, k) \; 0 \le u'_k < m-1, \text{ or} \quad (20z)$$

$$C_\mu = \sum_{k=1}^{m-v} F'(u'_k, k) \; 0 \le u'_k < m-1, \quad (26z)$$

where $u'_k$ belongs to a set U' defined as $$U'=\{0, 1, \ldots, m-2\}-\{p'_1, p'_2, \ldots, p'_{v-1}\}, \quad (30)$$

and $p'_k$ are as defined in equation (28).

We will now evaluate how the proposed method of selectively coding the unoccupied positions may reduce the complexity by applying the proposed technique in the coding of 27 pulses in 280 locations, i.e., n=280 and m=27. Since 2·m<n, the proposed coding approach may not be needed for generating the code for pulse positions ($C_\pi$). However, for coding of the pulse magnitude the proposed technique will be advantageously used.

It turns out that without using the proposed technique the worst case complexity of the encoding/decoding algorithm (when the low complexity combinatorial functions are used) in this particular example is when the number of non-zero positions (v) is between 25 and 27, i.e., between m and m−2. When v=25, then, using equation (26) will require 24 computations of the combinatorial function for encoding and several more for decoding. Use of the proposed technique (equation (26z)) in such a situation will require computation of combinatorial function only twice in the encoder and a significantly less number of times in the decoder when compared to other decoding techniques.

In accordance with the proposed technique for encoding/decoding consistent with embodiments of the present invention, the worst case complexity in this example is when v is close to m/2. In this case the encoding and decoding of number of non-zero positions v using equation 27 makes a significant contribution to the complexity. The storing of parameters (54 words storage required in this example) as described in the section "Encoding of Number of Non-zero Positions" reduces the complexity further.

The table below shows the reduction in complexity when the proposed method of coding the unoccupied positions is used for coding 27 pulses in 280 locations, and the coding is performed 2 times in a 20 ms frame. The table also shows the advantage to be gained from storing the parameters used in computation of code for the number of non-zero positions (equation 27). From the table we see that selectively coding the unoccupied positions resulted in a complexity improvement of 0.6 WMOPs (3.59 to 2.9) and if we also store the parameters used in equation (27) then the saving is 0.75 WMOPs (3.59 to 2.75).

The decoding is an inverse of encoding process and involves first decoding of number of non-zero positions (v) based on the received codeword C. Various methods, for example the one in Peng et al and Mittal et al (U.S. Pat. No. 6,662,154), for encoding/decoding the number of non-zero positions can be adopted for this purpose. Codewords $C_\pi$ for position and $C_\mu$ for magnitudes are extracted based on the codeword C and v. Position $p_1, p_2, \ldots, p_v$ is decoded based on codeword $C_\pi$.

The magnitudes $m_1, m_2, \ldots, m_v$ are decoded based on the codeword $C_\mu$. The coded signal is now decoded:

$$x_{p_k} = m_k s_k \quad (31)$$

| Storing Parameters | Coding Unoccupied positions when needed | Complexity (WMOPs) |
|---|---|---|
| NO | NO | 3.59 |
| YES | NO | 3.50 |
| NO | YES | 2.90 |
| YES | YES | 2.75 |

The technique, described herein of reducing the number of computations of combinatorial function by switching between coding of occupied and unoccupied positions, may be further enhanced by an improved approximate combinatorial function as will now be described. It is based upon the recognition that the decoder has significant complexity caused by the need of the decoder to repeatedly find the largest value of $p_k$ such that $F'(p_k, k)$ is less than a multi-precision number $C_k$. The decoder iteratively obtains such a value of $p_k$. These iterations may require several computations of the combinatorial functions F' which add to the complexity of the decoding process.

To further reduce the complexity of the approximate combinatorial function in (21), instead of pre-storing P'(i), a partial summation of P'(i) such as:

$$S'(n) = \sum_{i=1}^{n} P'(i), \quad (32)$$

and now equation (21) can be equivalently computed as:

$$F'(n,d) = R'(S'(n) - S'(n-d) - Q'(d)) \quad (33)$$

Even though using the approximate combinatorial functions has reduced the complexity significantly, the computation of these functions still forms one of the major parts of the complexity of the coding. One method of reducing the number of computation of combinatorial function by switching between coding of occupied position and an unoccupied position has been recently disclosed in a separate disclosure. Even with these improvements, the decoder has a significant complexity. This is because the decoder needs to repeatedly find the largest value of $p_k$ such that $F'(p_k, k)$ is less than a multi-precision number $C_k$. The decoder iteratively obtains such a value of $p_k$. These iterations may require several computations of the combinatorial functions which add to the complexity of the decoding process.

In recognition that there is a need for a coding method where the decoder does not need to iterate to obtain $p_k$, an improved combinatorial function in which the decoder does not need to iterate to obtain $p_k$ is presented. If equation (33) is used for defining $F'(p_k, k)$ then it may not be feasible to obtain such a solution without iterations.

We redefine the approximate combinatorial function as:

$$F'(n, d) = \begin{cases} R'(d \cdot P'(2 \cdot n - d + 1) - d - Q'(d)) & n \geq 2 \cdot d \\ F(n, n-d) & \text{Otherwise} \end{cases} \quad (34)$$

where $$P'(i) = 2^{-l(i)} \lfloor 2^{l(i)} \log_2(i) + 1 \rfloor, i \in [1, 2, \ldots, n]$$

is the logarithm of i, up to $l(i)=16$ decimal places, and $Q''(d) = Q'(d) + d$ is pre-calculated and stored such that $F'(n, d)$ defined in (34) satisfies the unique decodability inequality (24).

With $Q'(d)$ defined in (16) as the approximate logarithm (base 2) of d!, the $F'(n, d)$ defined in (34) is an approximation of actual combinatorial function defined in equation (3) and equation (5). Going back to equation (5), the numerator can be said to be the $d^{th}$ power of the geometric mean of: n, n−1, n−2, ..., n−d+1. The arithmetic mean of these numbers is $$n - \frac{d-1}{2}.$$

If we approximate the geometric mean with an arithmetic mean the approximation of equation (5) can be written as:

$$F'(n, d) \approx \frac{\left(n - \frac{d-1}{2}\right)^d}{\prod_{j=1}^{d}(j)} \quad (35)$$

If we take the logarithm (base 2) of equation (34) and used an approach similar to the one used in getting equation (21), we get $$F'(n, d) = R'\left(d \cdot \log_2(2 \cdot n - d + 1) - d - \sum_{i=1}^{d} \log_2(i)\right) \quad (36)$$

Thus $$F'(n,d) = R'(d \cdot P'(2 \cdot n - d + 1) - d - Q'(d)). \quad (37)$$

where $P'(n) \approx \log_2(n)$, $$Q'(d) \approx \sum_{i=1}^{d} \log_2(i), R(k) \approx 2^k.$$

A low complexity Taylor series is used for generating $R'(k)$. The method for generating $R'(k)$ is described in the discussion following equation (18) above.

As used herein and in the appended claims, a variety of factorial combinations, i.e. combinatorial function, F or approximate factorial combinations F', generally denoted at F', may be used without departing from the spirit and scope of the various embodiments put forth. As described above, these combinatorial functions may include, but not be limited to the following equations:

$$F(n, d) = \exp_a\left(\sum_{i=n-d+1}^{n} \log_a(i) - \sum_{j=1}^{d} \log_a(j)\right),$$

$$F(n, d) = R\left(\sum_{i=n-d+1}^{n} P(i) - Q(d)\right),$$

$$F'(n, d) = R'\left(\sum_{i=n-d+1}^{n} P'(i) - Q'(d)\right),$$

$$F'(n, r) = R\left(\sum_{i=n-r+1}^{n} P'(i) - Q'(r)\right),$$

$$F'(n, d) = R'(S'(n) - S'(n-d) - Q'(d)), \text{ and}$$

$$F'(n, d) = R'(d \cdot P'(2 \cdot n - d + 1) - d - Q'(d)).$$

Figure 4:
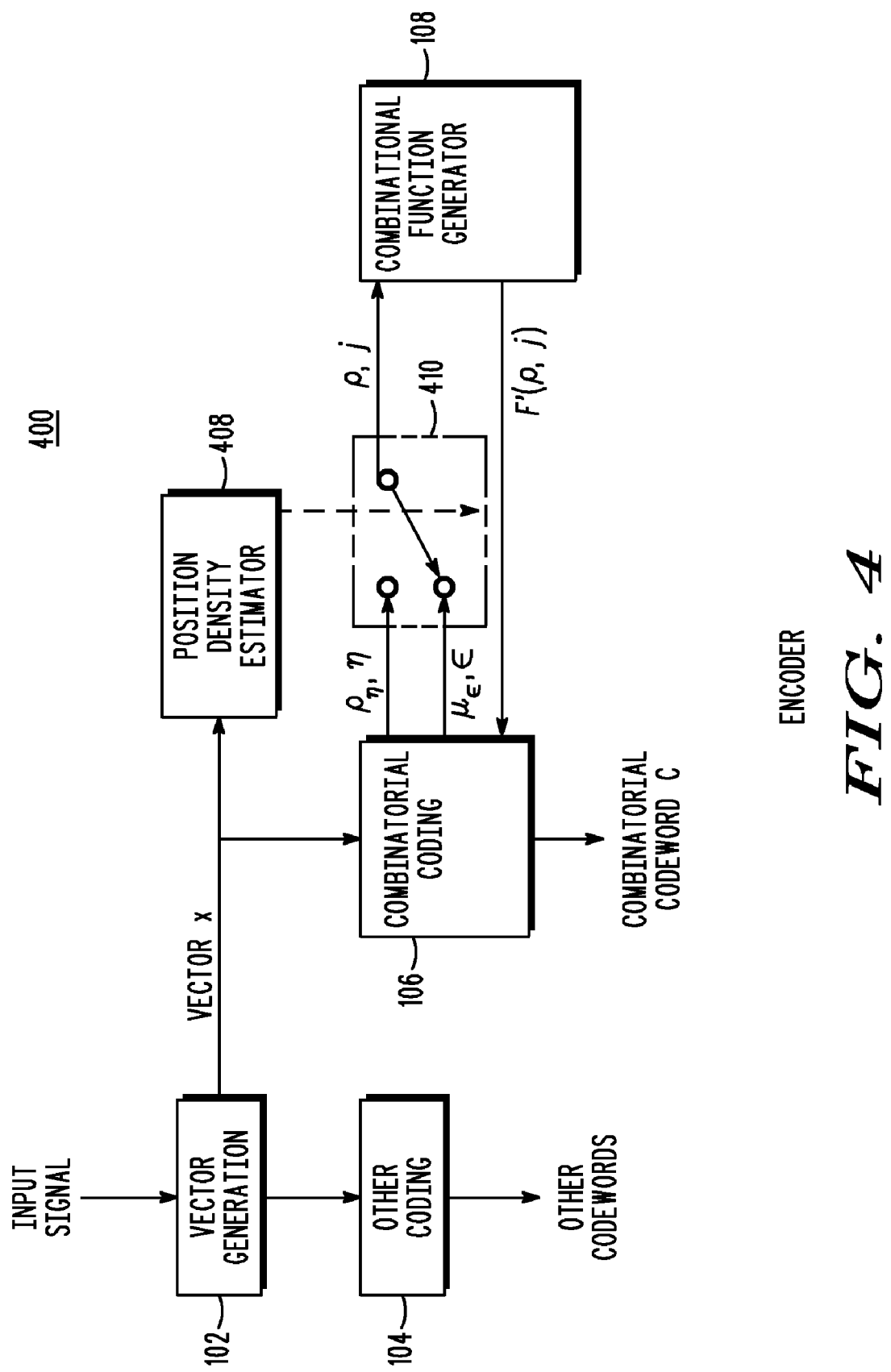
FIG. 4 is a block diagram of an encoder in accordance with various embodiments.

Adaptively switching between methods of encoding and decoding of pulse positions and/or pulse magnitudes in order to decrease the number of times that computation of the combinatorial function must be performed may be further understood by reference to the drawings. Referring now to FIG. 4, a block diagram 400 of the encoder is illustrated. As can be seen this encoder, while somewhat similar to that of FIG. 1, possesses switch 410, which is controlled by the density information supplied by position density estimator 408 as shown. The target vector x is input to the position density estimator 408, which outputs the density in terms of the total number of occupied positions (v), and in terms of number of occupied position which are yet to be coded (η) and the possible number of locations of these occupied positions (ρ). The combinatorial coding block 106 may generate and output both the occupied position ($p_k$) and unoccupied position ($u_k$) to switch 410. Which of these two, ($p_k$) or ($u_k$), that should be supplied to the combinatorial function generator 108 from switch 410 is decided by the switch 410. The switch may pass the unoccupied position ($u_k$) to 108 if the number of non-zero positions is higher than some predefined value. The switch may also pass the unoccupied position ($u_k$) if the ratio of number of occupied positions which are yet to be coded to the possible number of locations of these occupied positions is greater than a predefined value.

Figure 5:
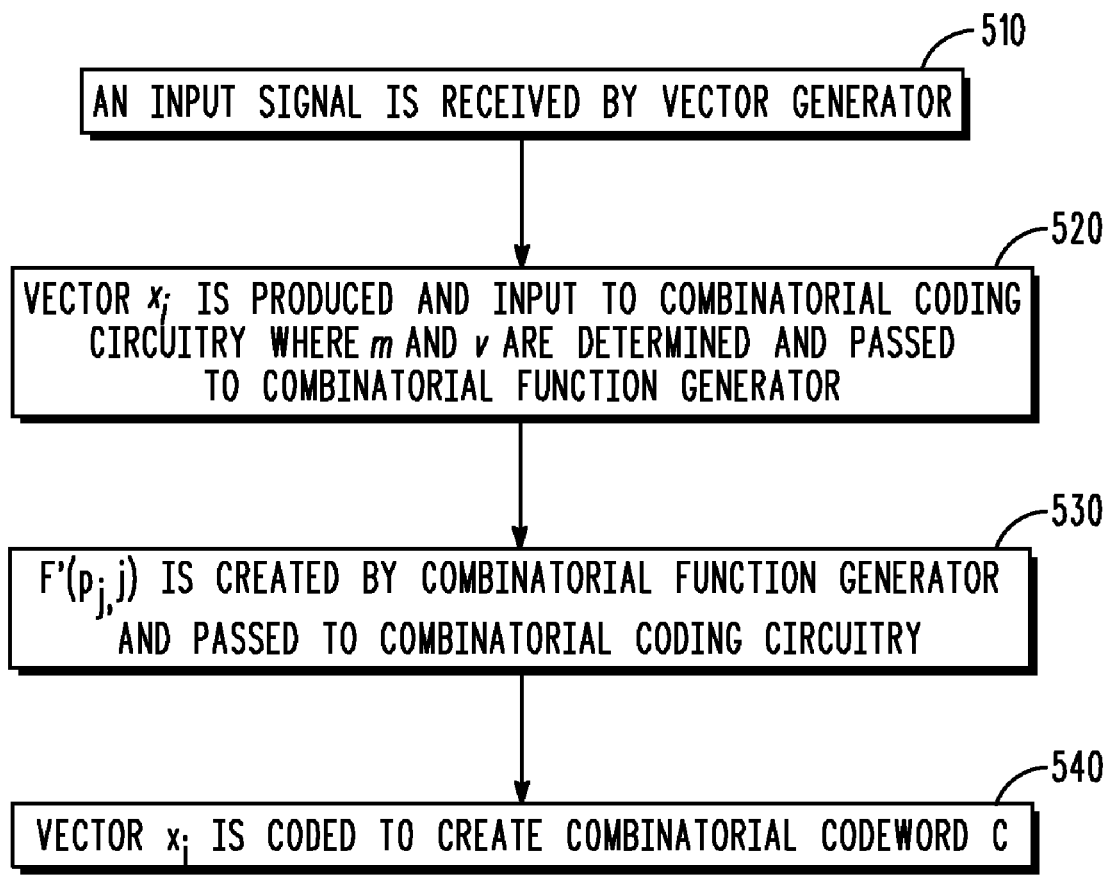
FIG. 5 is a flow chart showing operation of the encoder in accordance with various embodiments.

FIG. 5 is a flow chart showing simplified representation of the operation of the encoder of FIG. 4. The logic flow begins at 510 where an input signal is received by vector generator 102. As discussed above, the input signal may comprise speech, audio, image, video, or other signals. At 520 vector $x_i$ is produced and input into combinatorial coding circuitry 106 where m and v are determined and passed to combinatorial function generator 108. As discussed above, m is the total number of unit amplitude pulses (or sum of the absolute values of the integral valued components of $x_i$) and v is the number non-zero elements of $x_i$. At 530 $F'(p_j, j)$ is created by combinatorial function generator 108 and passed to combinatorial coding circuitry 106, where vector $x_i$ is coded to create combinatorial codeword C at 540. As discussed above, F'($p_j$,j) is created by replacing the functions P(i), Q(j), and R(k) in F($p_j$,j), with low complexity approximations of the original functions such that the conditions given in Equations 10 and 11 are satisfied.

Figure 6:
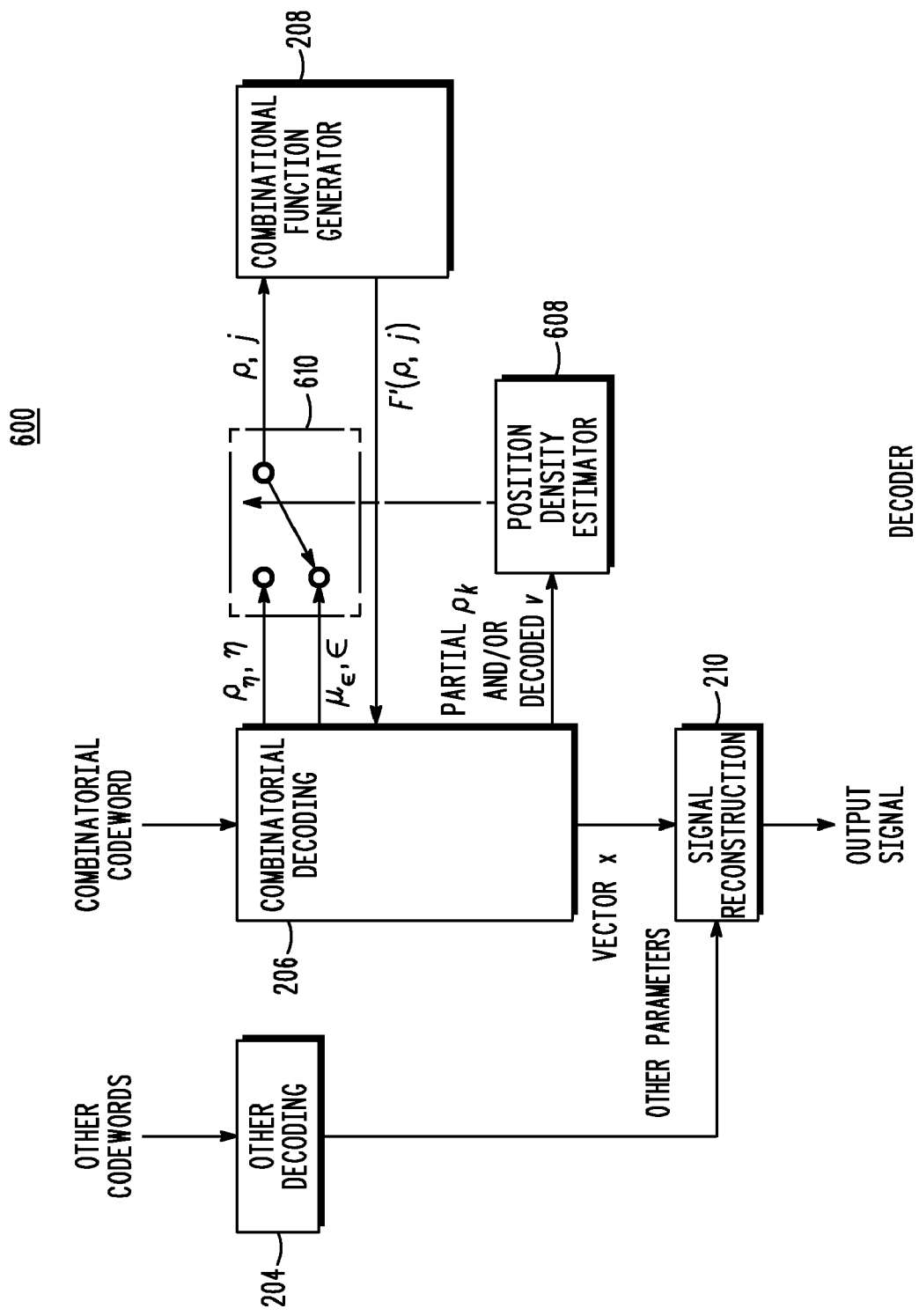
FIG. 6 is a block diagram of a decoder in accordance with various embodiments.

Referring now to FIG. 6, a block diagram 600 of a decoder consistent with certain embodiments is illustrated. The decoder 600 operates reverse of the encoder 400. As shown, decoder 600 comprises combinatorial decoding circuitry 206, signal reconstruction circuitry 210, other decoding circuitry 204, combinatorial function generator 208, switch 610, and position density estimator 608. During operation a combinatorial codeword is received by combinatorial decoding circuitry 206. Combinatorial decoding circuitry 206 provides n and d to combinatorial function generator, and receives F'(n, d) in response. Decoding circuitry 302 then creates vector $x_i$ based on F'(n,d). Circuitry 206 operates in a similar manner as circuitry 106, except subtraction replaces addition operations. In other words, $\Psi'_k = \Psi'_{k+1} - F'(p_k,k)$. Vector $x_i$ is passed to signal reconstruction circuitry 210 where the output signal (e.g., speech, audio, image, video, or other signals) is created based on $x_i$ and other parameters from other decoding circuitry 204. More specifically, the other parameters may include any number of signal reconstruction parameters associated with the signal coding paradigm being used in a particular embodiment. These may include, but are not limited to, signal scaling and energy parameters, and spectral shaping and/or synthesis filter parameters. Normally these parameters are used to scale the energy of and/or spectrally shape the reconstructed signal vector $x_i$ in such a manner as to reproduce the final output signal.

Figure 7:
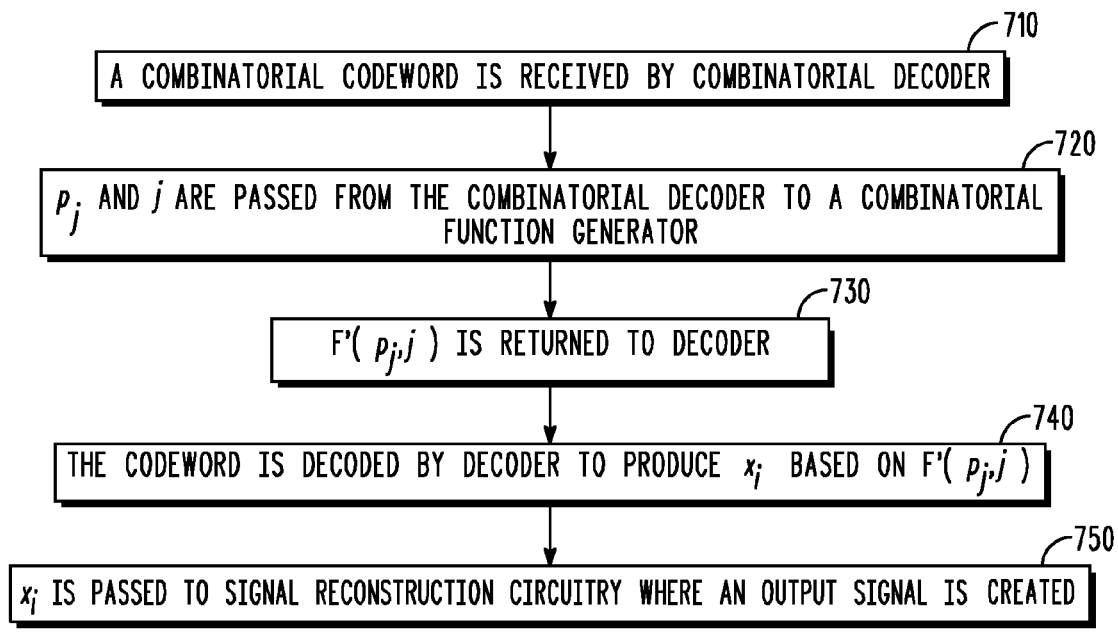
FIG. 7 is a flow chart showing operation of the decoder in accordance with various embodiments.

FIG. 7 is a flow chart showing simplified representation of the operation of the decoder of FIG. 6. The logic flow begins at 710 where a combinatorial codeword is received by combinatorial decoder 206. At 720 $p_j$ and j are passed from combinatorial decoder 206 to combinatorial function generator 208 and F($p_j$,j) is returned to decoder 206 at 730. The codeword is decoded by decoder 206 based on F($p_j$,j) at 740 to produce vector $x_i$ and $x_i$ is passed to signal reconstruction circuitry 210 where an output signal is created at 750.

It can be seen that a proposed method of coding of "unoccupied position" in various embodiments is applied in both coding of positions and magnitude. However, one of ordinary skill in the art will see that this method can be applied to coding of either of these parameters. Similarly, the decoder operates in the inverse of the encoder. While a decoder of the prior art always decodes the position ($p_k$) and ($p'_k$), a decoder consistent with embodiments of the current invention may decode the unoccupied positions ($u_k$) when $2 \cdot v > n$, or may decode $u'_k$ when $2 \cdot (v-1) > m-1$. After decoding $u_k$ and $u'_k$, the decoder may convert them to $p_k$, $p'_k$, and $m_k$.

Starting with a simple overview of encoding in keeping with certain embodiments of the current invention, consider the following flow:

a signal coded using sequence of pulses is received;

the number of non-zero pulse position (v) is determined and code $C_\upsilon$ for the v using equation (27) may be generated (note that this is an optional step and codeword (C) may indeed be approximated by codes $C_\pi$ and $C_\mu$);

positions of non-zero pulses $p_1, p_2, \ldots, p_v$ are determined; If $2 \cdot v \leq n$ then generate code $C_\pi$ for the position using equation (25) otherwise generate code $C_\pi$ for the position using equation (25z);

magnitudes of non-zero pulses $m_1, m_2, \ldots, m_v$ are determined; If $2 \cdot (v-1) \leq m-1$ then generate code $C_\mu$ for the magnitude using equation (26) otherwise generate code $C_\mu$ for the magnitude using equation (26z).

combine codes $C_\upsilon$, $C_\pi$, and $C_\mu$ to form a codeword (C).

A simplified flow for decoding in accordance with certain embodiments may be considered:

receive a codeword (C) representing a signal coded using sequence of pulses.

find the number of non-zero pulse position (v) wherein v is the largest value such that $C_\upsilon$ in equation (21) is not more than C. (again, note that decoding may occur without explicitly determining $C_\upsilon$ in equation (21);

extract the codeword $C_\pi$, and $C_\mu$ based on the codeword C and the number of non-zero positions (v);

if $2 \cdot v \leq n$ then decode the occupied positions $p_1, p_2, \ldots, p_v$ based on $C_\pi$; otherwise decode the unoccupied positions $u_1, u_2, \ldots, u_v$ and compute the occupied positions from the unoccupied positions;

if $2 \cdot (v-1) \leq m-1$ then decode $p'_1, p'_2, \ldots, p'_{v-1}$ based on $C_\mu$; otherwise decode $u'_1, u'_2, \ldots, u'_{v-1}$. Obtain the $m_1, m_2, \ldots, m_v$ magnitudes of non-zero positions based on $p'_1, p'_2, \ldots, p'_{v-1}$ or $u'_1, u'_2, \ldots, u'_{v-1}$; and decode the encoded signal using equation (31) based on the decoded non-zero position and the decoded magnitudes of the non-zero positions.

These simplified flows will be further examined below.

Figure 8:
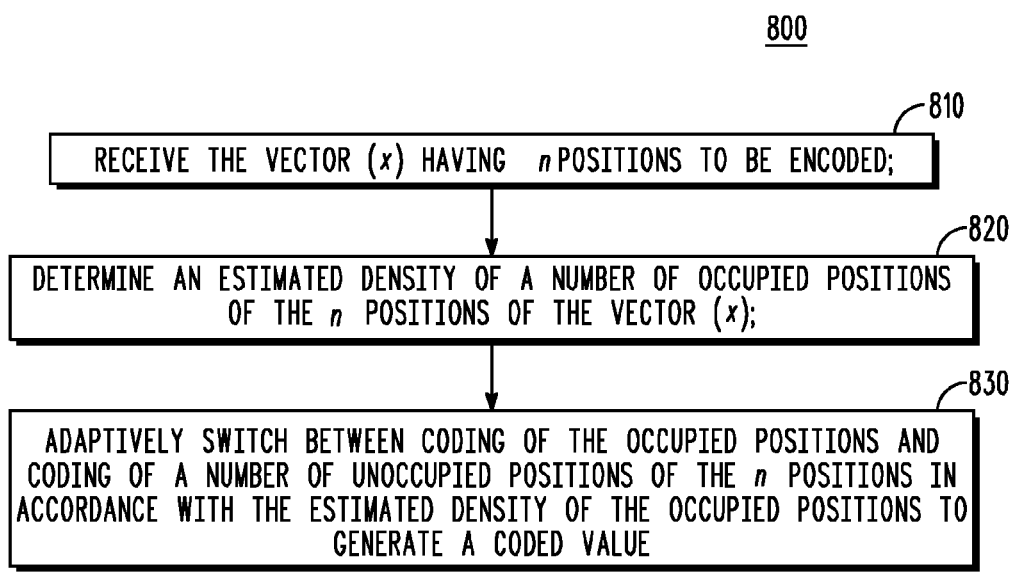
FIG. 8 is a flow chart showing operation of an encoder using estimated density in accordance with various embodiments.

Referring now to FIG. 8, flow 800 illustrates an encoding process of operating an encoder in accordance with certain embodiments of the present invention may be considered in terms of adaptively switching between coding of occupied and unoccupied positions of a vector as a function of estimated density. At Block 810, the vector (x) having n positions to be encoded is received. At Block 820, an estimated density of a plurality of occupied positions of the n positions of the vector (x) is determined. At Block 830, adaptive switching between coding of the plurality of occupied positions and coding of a plurality of unoccupied positions of the n positions in accordance with the estimated density of the plurality of occupied positions to generate a coded value occurs. The estimated density of a position is determined by a number of the plurality of unoccupied positions vis-à-vis a number of the plurality of occupied positions and so adaptively switching between coding of the plurality of occupied positions and coding of the plurality of unoccupied positions further comprises coding the plurality of unoccupied positions when a number of the plurality of unoccupied positions is less than a threshold value; and coding the plurality of occupied positions when a number of the plurality of unoccupied positions is not less than the threshold. The threshold value may be considered to be the number of the plurality of occupied positions, such as n/2. The codeword (C) is generated from the plurality of code values, each value determined at a plurality of positions of the n positions of the vector (x).

Figure 9:
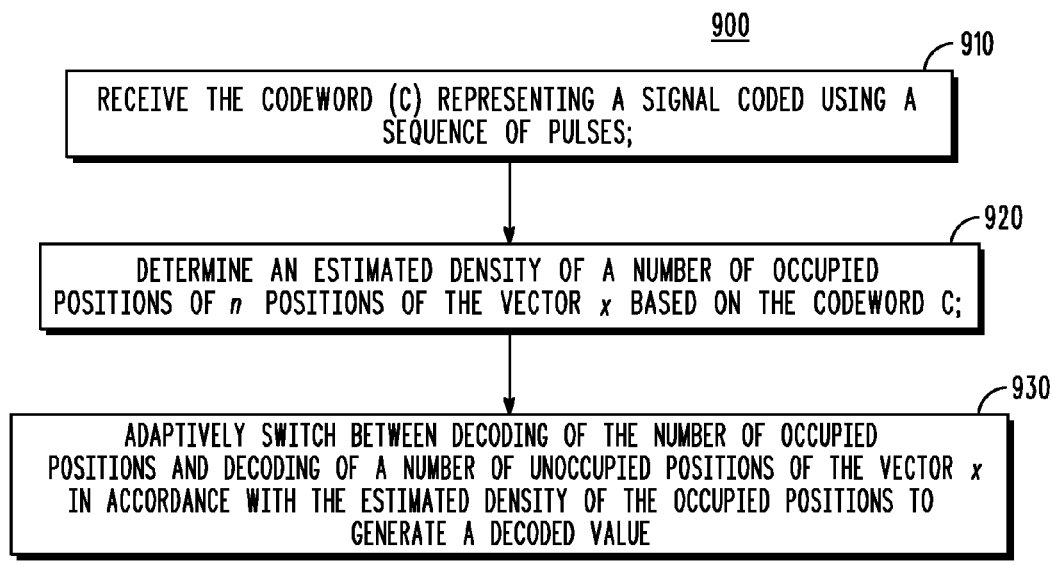
FIG. 9 is a flow chart showing operation of a decoder using estimated density in accordance with various embodiments.

Referring now to FIG. 9, flow 900 illustrates a decoding process of operating an decoder in accordance with certain embodiments of the present invention. At Block 910, the codeword (C) representing a signal coded using a sequence of pulses is received. At Block 920, an estimated density of a plurality of occupied positions of n positions of the vector (x) based on the codeword C is determined. At Block 930, adaptive switching between decoding of the plurality of occupied positions and decoding of a plurality of unoccupied positions of the vector x in accordance with the estimated density of the plurality of occupied positions to generate a decoded value is performed. The estimated density of a position may be determined by a number of the plurality of unoccupied positions vis-à-vis the number of the plurality of occupied positions and adaptive switching between decoding of the plurality of occupied positions and decoding of the plurality of unoccupied positions may further comprise: decoding the plurality of unoccupied positions to generate a plurality of decoded unoccupied positions and generating a plurality of decoded occupied positions from the plurality of decoded unoccupied positions when the number of the plurality of unoccupied positions is less than a threshold value; and decoding the plurality of occupied positions when the number of the plurality of unoccupied positions is not less than the threshold. The threshold value may be the number of the plurality of occupied positions. The vector (x) is accordingly generated from the decoded value in this instance. This may be further accomplished by extracting a code $C_\mu$ and a code $C_\pi$ from the codeword (C) based upon a number of a plurality of occupied positions v of the vector x.

Figure 10:
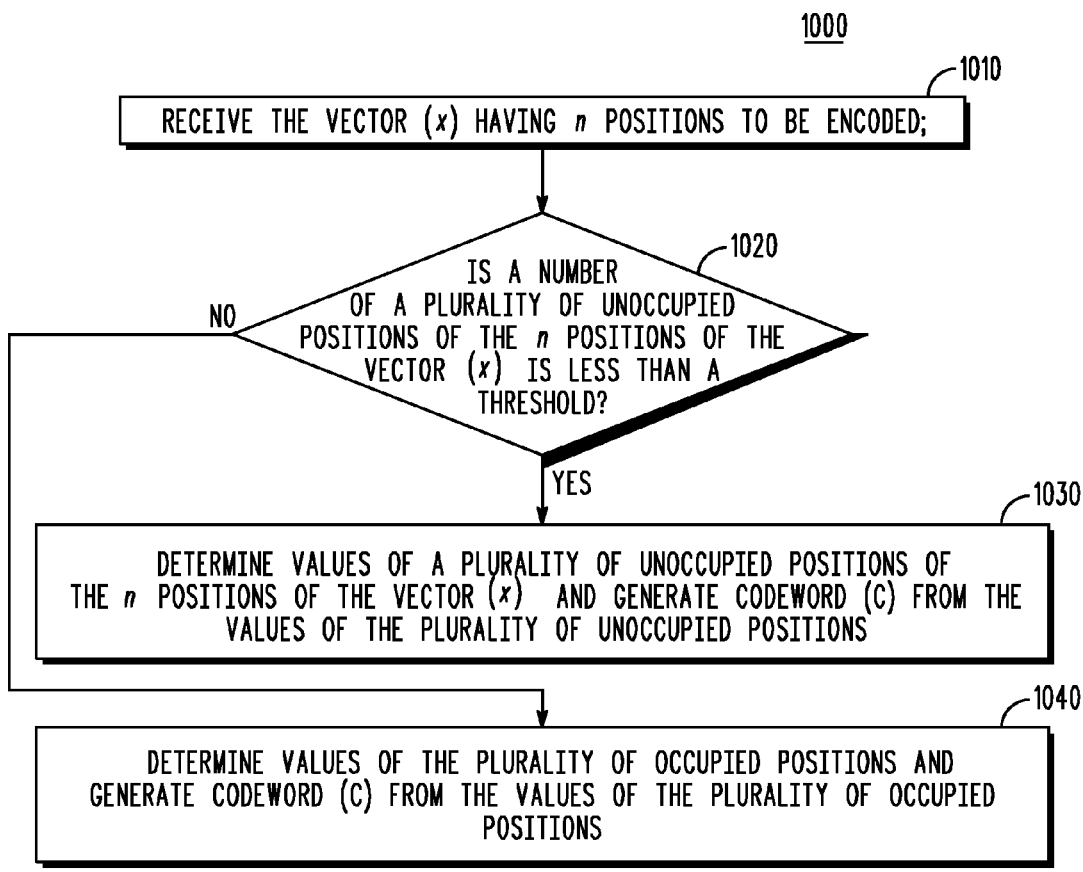
FIG. 10 is a flow chart showing operation of an encoder vis-à-vis a threshold value in accordance with various embodiments.
Figure 11:
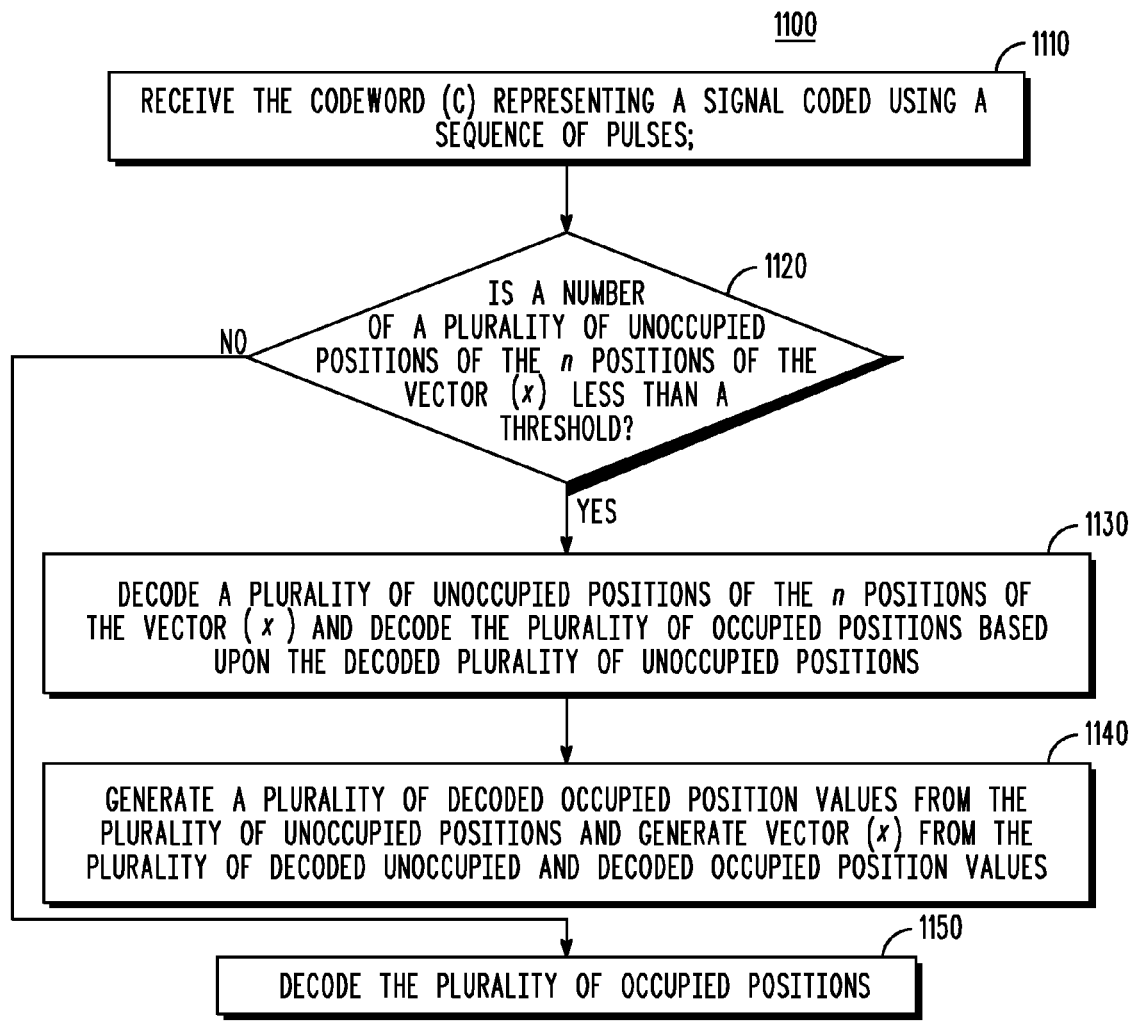
FIG. 11 is a flow chart showing operation of a decoder vis-à-vis a threshold value in accordance with various embodiments.

Stated in slightly different terms, the flows 1000 and 1100 of FIGS. 10 and 11, respectively, illustrate the use of estimated density but in terms of looking directly at the number of unoccupied positions vis-à-vis a threshold, such as the number of occupied positions. Flow 1000 of FIG. 10 illustrates a method for operating an encoder that is operable to encode a codeword (C) from a vector (x). At Block 1010, the vector (x) having n positions to be encoded is received. Decision Block 1020 inquires whether a number of a plurality of unoccupied positions of the n positions of the vector (x) is less than a threshold. If Yes, than at Block 1030, values of a plurality of unoccupied positions of the n positions of the vector (x) are determined and codeword (C) generated from the values of the plurality of unoccupied positions. If No, than at Block 1040, values of the plurality of occupied positions are determined and codeword (C) generated from the values of the plurality of occupied positions.

For the coding of pulse magnitudes in an exemplary embodiment in which the number of the plurality of unoccupied positions of the n positions of the vector (x) is less than the threshold, equal to (m−1)/2, determining values of the plurality of unoccupied positions may further comprise: determining a plurality of pulse magnitudes $m_1, m_2, \ldots, m_\nu$ of the plurality of occupied positions; generating a plurality of unoccupied pulse positions $u'_k$ based on the plurality of pulse magnitudes; and encoding the plurality of magnitudes when 2·(v−1)>(m−1) by position encoding of m−v unoccupied pulse positions located at m−1 locations to generate a code $C_\mu$ for the plurality of pulse magnitudes. Encoding the plurality of pulse magnitudes of the plurality of unoccupied positions may then further comprise: generating a code $C_\mu$ for the plurality of magnitudes in accordance with $$C_\mu = \sum_{k=1}^{m-v} F'(u'_k, k) \ 0 \le u'_k < m-1,$$

where $u'_k$ belongs to a set U' defined as U'={0, 1, . . . , m−2}−{$p'_1, p'_2, \ldots, p'_{v-1}$} and $$p'_k = \sum_{j=1}^{k} m_j - 1$$

The codeword (C) in this instance may be at least partially determined by the code $C_\mu$ of the plurality of pulse magnitudes.

Continuing with the exemplary embodiment in which the number of the plurality of unoccupied positions of the n positions of the vector (x) is less than the threshold, the coding of a plurality of pulse positions of the plurality of unoccupied positions to generate a code $C_\pi$ for the plurality of unoccupied positions may also optionally be undertaken. The code $C_\pi$ for the plurality of unoccupied positions is generated in accordance with $$C_\pi = \sum_{k=1}^{n-v} F'(u_k, k) \ 0 \le u_k < n.$$

Moreover, encoding a plurality of pulse positions of the plurality of occupied positions to generate a code $C_\pi$ for the plurality of occupied positions may be performed according to $$C_\pi = \sum_{k=1}^{v} F'(p_k, k) \ 0 \le p_k < n.$$

Needless to say, in such cases, the codeword (C) is at least partially determined by the codes $C_\pi$ and $C_\mu$.

While it has been described that both magnitude and position encoding may be undertaken and position encoding undertaken in combination with magnitude encoding, these two types of encoding may be undertaken separately or in combination. For instance, in an instance in which it is desired to undertake position encoding only, consider the following. determining a plurality of non-zero pulse positions $p_1, p_2, \ldots, p_\nu$ within the vector x may comprise: selectively encoding the plurality of unoccupied positions to generate a code $C_\pi$ for the plurality of unoccupied positions in accordance with $$C_\pi = \sum_{k=1}^{n-v} F'(u_k, k) \ 0 \le u_k < n.$$

Conversely, if only magnitude encoding is undertaken and where the number of the plurality of unoccupied positions of the n positions of the vector (x) is not less than the threshold, equal to (m−1)/2, determining values of the plurality of occupied positions and generating codeword (C) from the values of the plurality of occupied positions may further comprise: determining a plurality of pulse magnitudes $m_1, m_2, \ldots, m_\nu$ of the plurality of occupied positions when 2·(v−1)≦m−1 to generate code $C_\mu$ for the pulse magnitudes in accordance with $$C_\mu = \sum_{k=1}^{v-1} F'\left(\sum_{j=1}^{k} m_j - 1, k\right) \ 1 \le \sum_{j=1}^{k} m_j, m_k < m;$$

and generating the codeword C from at least the code $C_\mu$.

In those occurrences, however, where if the number of the plurality of unoccupied positions of the n positions of the vector (x) is not less than the threshold, the method would include determining values of the plurality of occupied positions and generating codeword (C) from the values of the plurality of occupied positions and in the case of position encoding further comprise: encoding a plurality of pulse positions $p_1, p_2, \ldots, p_\nu$ of the plurality of occupied positions to generate code $C_\pi$ in accordance with $$C_\pi = \sum_{k=1}^{v} F'(p_k, k) \ 0 \le p_k < n.$$

Referring back to FIG. 4, operation of encoder 400 would comprise the following of combinatorial coding circuitry 106: receiving a vector (x) having n positions to be encoded; determining an estimated density of a plurality of occupied positions of the n positions of the vector (x); and adaptively switching between coding of the plurality of occupied positions and coding of a plurality of unoccupied positions of the n positions in accordance with the estimated density of the plurality of occupied positions to generate a coded value. As previously taught, the estimated density of a position may be determined by a number of the plurality of unoccupied positions vis-à-vis a number of the plurality of occupied positions and adaptively switching between coding of the plurality of occupied positions and coding of the plurality of unoccupied positions performed by the combinatorial coding circuitry. This coding would further comprise: coding the plurality of unoccupied positions when a number of the plurality of unoccupied positions is less than a threshold value; and coding the plurality of occupied positions when a number of the plurality of unoccupied positions is not less than the threshold. As will be described further, determining the estimated density and adaptively switching between coding of the plurality of occupied positions and coding of the plurality of unoccupied positions based upon the estimated density may be dynamically performed at a plurality of positions of the n positions of vector (x).

Flow 1100 of FIG. 11 illustrates a method for operating a decoder that is operable to generate a vector (x) from a received codeword (C). At Block 1110, a codeword (C) representing a signal coded using a sequence of pulses is received. At Decision Block 1120, the inquiry is whether a number of a plurality of unoccupied positions of the n positions of the vector (x) is less than a threshold. If Yes, then at Block 1130, a plurality of unoccupied positions of the n positions of the vector (x) and the plurality of occupied positions, based upon the decoded plurality of unoccupied positions, are decoded. At Block 1140, a plurality of decoded occupied position values from the plurality of unoccupied positions are generated and vector (x) is generated from the plurality of decoded unoccupied and decoded occupied position values. If No, then the flow continues to Block 1150, where the plurality of occupied positions are decoded.

It can be understood that a code $C_\mu$ and a code $C_\pi$ may be extracted from the codeword (C) based upon a number of a plurality of occupied positions v of the vector x.

In the condition in which the number of the plurality of unoccupied positions of the n positions of the vector (x) is less than the threshold, magnitude decoding may further comprise: decoding a plurality of unoccupied pulse positions $u'_k$; decoding a plurality of pulse magnitudes $m_1, m_2, \ldots, m_v$ of the plurality of occupied positions from the extracted code $C_\mu$ and the plurality of decoded unoccupied pulse positions $u'_k$; and decoding the codeword (C) using the decoded plurality of pulse magnitudes $m_1, m_2, \ldots, m_v$ of the plurality of occupied positions to generate the vector (x) in accordance with $x_{p_k} = m_k s_k$.

Similarly, when the number of the plurality of unoccupied positions of the n positions of the vector (x) is less than the threshold, position decoding may comprise: decoding a plurality of unoccupied pulse positions $u_k$; generating a plurality of decoded occupied pulse positions from the plurality of decoded unoccupied pulse positions $u_k$; and decoding the codeword (C) using the decoded unoccupied pulse positions and the decoded occupied pulse positions to generate the vector (x).

Referring back to FIG. 6, operation of decoder 600 would comprise the following of combinatorial decoding circuitry 206: receiving the codeword (C) representing a signal coded using a sequence of pulses; determining an estimated density of a plurality of occupied positions of n positions of the vector (x) based on the codeword C; and adaptively switching between decoding of the plurality of occupied positions and decoding of a plurality of unoccupied positions of the vector x in accordance with the estimated density of the plurality of occupied positions to generate a decoded value. Again, as described above, the estimated density of a position may be determined by a number of the plurality of unoccupied positions vis-à-vis the number of the plurality of occupied positions and adaptively switching between decoding of the plurality of occupied positions and decoding of the plurality of unoccupied positions performed by the combinatorial decoding circuitry would further comprise: decoding the plurality of unoccupied positions to generate a plurality of decoded unoccupied positions and generating a plurality of decoded occupied positions from the plurality of decoded unoccupied positions when the number of the plurality of unoccupied positions is less than a threshold value; and decoding the plurality of occupied positions when the number of the plurality of unoccupied positions is not less than the threshold. As will be described further, determining the estimated density and adaptively switching between decoding of the plurality of occupied positions and decoding of the plurality of unoccupied positions based upon the estimated density may be dynamically performed at a plurality of positions of the n positions of vector (x).

As previously mentioned, switching between modes of encoding or decoding may occur dynamically at more than one location as a function of the estimated density at various locations.

In accordance with various embodiments of the current invention, whether to code the occupied positions or to code the unoccupied position is based on the average density which is defined as the ratio of the occupied positions to the number of locations. In the previous section, we have illustrated a method in which the decision is made only once and the same approach, i.e., either coding the occupied positions or coding the unoccupied position is adopted for all the positions. Since the distribution of the occupied position may not be uniform over all the locations, the density is also not uniform. Hence, it may be worthwhile to keep switching the decision to code the occupied or unoccupied positions based on the density at various instances. Let us illustrate this by an example. Consider out of n=27 locations there are 16 occupied positions. The occupied positions are 0, 7, 9, 10, 12, 13, 15, 16, 17, 18, 19, 20, 21, 22, 24, and 25. In the prior art method these occupied positions are directly coded using equation (26) and as described above, the number of occupied positions being more than n/2, the unoccupied positions 1, 2, 3, 4, 5, 6, 8, 11, 14, 23, and 26 are coded using equation (26z). Note that an encoder of the prior art required 16 computations of combinatorial function while the encoder in the current invention requires 11 computations of the combinatorial function F or F' in this example. Looking at the occupied and unoccupied positions, it can be seen that coding using occupied position till first 5 pulse positions, i.e., positions 0, 7, 9, 10, and 12, and then coding the unoccupied positions, i.e., positions 14, 23, and 26, will reduce this to 8 computations of the combinatorial functions in the encoder. However the decoder needs to know which method is used for encoding and where the switching from one method to other method has taken place. Since the decoder starts decoding from the highest position to the lowest position, the highest position is coded based on the number of occupied positions. Subsequently, the density of the occupied positions is estimated and if the density is less than 0.5 then the next occupied position is coded otherwise the next unoccupied position is coded.

To illustrate this, consider again the above example. Since initial occupied position density is greater than 0.5, the highest unoccupied position 26 is coded as F'(26,11). Now the estimated density of occupied positions is 16 position in 26 location which is also greater than 0.5 and hence the next unoccupied position 23 is coded as F'(23,10). Now it can be inferred (even at the decoder) that the positions 24 and 25 were occupied. The occupied position density now becomes 14 occupied positions in 23 locations which is still more than 0.5 and hence next unoccupied position 14 is coded as F'(14, 9). It can be easily estimated the density of remaining occupied position is 6 pulses in 14 locations which is less than 0.5. Now, the next occupied position 13 is coded as F'(13,6). Now the density of occupied positions is estimated as 5 pulses in 13 locations which is less than 0.5 and hence the next time occupied position is coded, i.e., position 12 is coded as F'(12, 5). Now there are 4 occupied positions in 12 locations, and hence again the occupied position is coded as F'(10,4). Using the same arguments, the next three occupied positions are coded as F'(9,3), F'(7,2), and F'(0, I). Thus the codeword $$C_\pi = F'(0,1) + F'(7,2) + F'(9,3) + F'(10,4) + F'(12,5) + F'(13,6) F'(14,9) + F'(23,10) + F'(26,11)$$

needs nine computation of the combinatorial functions in this example.

Dynamic Switching—Encoder

With regard to dynamic switching between encoding methodologies at one or more positional locations, such switching may be a function of the estimated density determined at one or more locations. Thus, determining the estimated density and adaptively switching between coding of the plurality of occupied positions and coding of the plurality of unoccupied positions based upon the estimated density is dynamically performed at a plurality of positions of the n positions of vector (x). The occupied positions $p_1, p_2, \ldots, p_v$ and the unoccupied $u_1, u_2, \ldots, u_{n-v}$ of the n positions of the vector (x) are determined. For the positions $p_k$ of the n positions:

a. if $2 \cdot v > n$ encoding a highest unoccupied position as $F'(u_{n-v}, v)$ but if $2 \cdot v \leq n$ then encoding the highest occupied position as $F'(p_v, v)$ wherein a last encoded position ($\rho$) is set to $p_v$ or $u_{n-v}$;
b. calculating a number of occupied positions ($\eta$) and a number of unoccupied positions ($\epsilon$) which are less than the last encoded position ($\rho$);
c. if $2 \cdot \eta \leq \rho$ then obtaining a maximum occupied position $p_k$ less than $\rho$ and coding the position as $F'(p_k, \eta)$, wherein the last encoded position is $\rho = p_k$;
d. if $2 \cdot \eta > \rho$ then obtaining a maximum unoccupied position $u_k$ less than $\rho$ and coding the position as $F'(u_k, \epsilon)$, wherein the last encoded position is $\rho = u_k$.
e. repeating b, c, and d until $\eta$ or $\epsilon$ is equal to 0;

The position codes generated in d and e may be summed up to generate position code $C_\pi$.

In the case of magnitude encoding, a plurality of pulse magnitudes $m_1, m_2, \ldots, m_v$ of the plurality of occupied positions are determined. Further, the occupied positions $p'_1, p'_2, \ldots, p'_{v-1}$ and the unoccupied positions $u'_1, u'_2, \ldots, u'_{m-v}$, of the n positions of the vector (x) based upon the plurality of pulse magnitudes $m_1, m_2, \ldots, m_v$ are determined as well. For the positions $p'_k$ of the n positions:

a. if $2 \cdot (v-1) > m-1$ encoding a highest unoccupied position as $F'(u'_{m-v}, v-1)$ but if $2 \cdot (v-1) \leq m-1$ then encoding the highest unoccupied position as $F'(p'_v, v-1)$, wherein a last encoded position ($\rho'$) is set to $p'_v$ or $u'_{m-v}$;
b. calculating a number of occupied positions ($\eta'$) and a number of unoccupied positions ($\epsilon'$) which are less than the last encoded position ($\rho'$);
c. if $2 \cdot \eta' \leq \rho'$ then obtaining a maximum occupied position $p'_k$ less than $\rho'$ and coding the position as $F'(p'_k, \eta')$, wherein the last encoded position is $\rho' = p'_k$;
d. if $2 \cdot \eta' > \rho'$ then obtaining a maximum unoccupied position $u'_k$ less than $\rho'$ and coding the position as $F'(u'_k, \epsilon')$, wherein the last encoded position is $\rho' = \mu'_k$.
e. repeating b, c, and d until $\eta'$ or $\epsilon'$ is equal to 0;

The position codes generated in d and e are summed up to generate position code $C_\mu$.

Dynamic Switching—Decoder

With regard to dynamic switching during decoding, the estimated density is determined and adaptive switching between decoding of the plurality of occupied positions and decoding of the plurality of unoccupied positions based upon the estimated density is dynamically performed at a plurality of positions of the n positions of vector (x). For position decoding, switching comprises for the positions $p_k$ of the n positions:

a. if $2 \cdot v > n$ decoding a highest unoccupied position as $F'(u_{n-v}, v)$ from code $C_\pi$ but if $2 \cdot v \leq n$ then decoding the highest occupied position as $F'(p_v, v)$, wherein a last decoded position ($\rho$) is set to $p_v$ or $u_{n-v}$;
b. calculating a number of occupied positions ($\eta$) and a number of unoccupied positions ($\epsilon$) which are less than the last decoded position ($\rho$);
c. if $2 \cdot \eta \leq \rho$ then obtaining a maximum occupied position $p_k$ less than $\rho$ and decoding the position as $F'(p_k, \eta)$, wherein the last decoded position is $\rho = p_k$;
d. if $2 \cdot \eta > \rho$ then obtaining a maximum occupied position $u_k$ less than $\rho$ and decoding the position as $F'(u_k, \epsilon)$, wherein the last decoded position is $\rho = u_k$.
e. repeating b, c, and d until $\eta$ or $\epsilon$ is equal to 0;

The plurality of occupied positions from the maximum occupied positions $p_k$ and the maximum unoccupied positions $u_k$ generated in a, b, c, d and e are decoded.

With regard to magnitude decoding, a plurality of pulse magnitudes $m_1, m_2, \ldots, m_v$ of the plurality of occupied positions is determined. The occupied positions $p'_1, p'_2, \ldots, p'_{v-1}$ and the unoccupied $u'_1, u'_2, \ldots, u'_{m-v}$, of the n positions of the vector (x) based upon the plurality of pulse magnitudes $m_1, m_2, \ldots, m_v$ are also determined. And, for the positions $p'_k$ of then positions:

a. if $2 \cdot (v-1) > m-1$ decoding a highest unoccupied position as $F'(u'_{m-v}, v-1)$ code $C_\mu$ but if $2 \cdot (v-1) \leq m-1$ then decoding the highest occupied position as $F'(p'_v, v-1)$, wherein a last decoded position ($\rho'$) is set to $p'_v$ or $u'_{m-v}$;
b. calculating a number of occupied positions ($\eta'$) and a number of unoccupied positions ($\epsilon'$) which are less than the last decoded position ($\rho'$);
c. if $2 \cdot \eta' \leq \rho'$ then obtaining a maximum occupied position $p'_k$ less than $\rho'$ and decoding the position as $F'(p'_k, \eta')$, wherein the last decoded position is $\rho' = p'_k$;
d. if $2 \cdot \eta' > \rho'$ then obtaining a maximum unoccupied position $u'_k$ less than $\rho'$ and decoding the position as $F'(u'_k, \epsilon')$, wherein the last decoded position is $\rho' = \mu'_k$.
e. repeating b, c, and d until $\eta'$ or $\epsilon'$ is equal to 0;

The plurality of occupied positions from the maximum occupied positions $p_k$ and the maximum unoccupied positions $u_k$ generated in a, b, c, d and e are decoded.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for operating an encoder that encodes a codeword (C) from a vector (x), the method comprising:
   receiving the vector (x) having n positions to be encoded;
   determining an estimated density of a plurality of occupied positions of the n positions of the vector (x); and
   adaptively switching between coding of the plurality of occupied positions and coding of a plurality of unoccupied positions of the n positions in accordance with the estimated density of the plurality of occupied positions to generate a coded value.

2. The method of claim 1, wherein determining the estimated density and adaptively switching between coding of the plurality of occupied positions and coding of the plurality of unoccupied positions based upon the estimated density is dynamically performed at a plurality of positions of the n positions of vector (x).

3. The method of claim 2, further comprising:
   determining the occupied positions $p_1, p_2, \ldots, p_v$ and the unoccupied $u_1, u_2, \ldots, u_{n-v}$ of the n positions of the vector (x);
   for the positions $p_k$ of the n positions:
   a. if $2 \cdot v > n$ encoding a highest unoccupied position as $F'(u_{n-v}, v)$ but if $2 \cdot v \leq n$ then encoding the highest unoccupied position as $F'(p_v, v)$, wherein a last encoded position ($\rho$) is set to $p_v$ or $u_{n-v}$;
   b. calculating a number of occupied positions ($\eta$) and a number of unoccupied positions ($\epsilon$) which are less than the last encoded position ($\rho$);
   c. if $2 \cdot \eta \leq \rho$ then obtaining a maximum occupied position $p_k$ less than $\rho$ and coding the position as $F'(p_k, \eta)$, wherein the last encoded position is $\rho = p_k$;
   d. if $2 \cdot \eta > \rho$ then obtaining a maximum unoccupied position $u_k$ less than $\rho$ and coding the position as $F'(u_k, \epsilon)$, wherein the last encoded position is $\rho = u_k$.
   e. repeating b, c, and d until $\eta$ or $\epsilon$ is equal to 0;
   summing up the position codes generated in d and e to generate position code $C_\pi$.

4. The method of claim 2, further comprising:
   determining a plurality of pulse magnitudes $m_1, m_2, \ldots, m_v$ of the plurality of occupied positions;
   determining the occupied positions $p'_1, p'_2, \ldots, p'_{v-1}$ and the unoccupied positions $u'_1, u'_2, \ldots, u'_{m-v}$ of the n positions of the vector (x) based upon the plurality of pulse magnitudes $m_1, m_2, \ldots, m_v$; and
   for the positions $p'_k$ of the n positions:
   a. if $2 \cdot (v-1) > m-1$ encoding a highest unoccupied position as $F'(u'_{m-v}, v-1)$ but if $2 \cdot (v-1) \leq m-1$ then encoding the highest unoccupied position as $F'(p'_v, v-1)$, wherein a last encoded position ($\rho'$) is set to $p'_v$ or $u'_{m-v}$;
   b. calculating a number of occupied positions ($\eta'$) and a number of unoccupied positions ($\epsilon'$) which are less than the last encoded position ($\rho'$);
   c. if $2 \cdot \eta' \leq \rho'$ then obtaining a maximum occupied position $p'_k$ less than $\rho'$ and coding the position as $F'(p'_k, \eta')$, wherein the last encoded position is $\rho' = p'_k$;
   d. if $2 \cdot \eta' > \rho'$ then obtaining a maximum unoccupied position $u'_k$ less than $\rho'$ and coding the position as $F'(u'_k, \epsilon')$, wherein the last encoded position is $\rho' = u'_k$.
   e. repeating b, c, and d until $\eta'$ or $\epsilon'$ is equal to 0;
   summing up the position codes generated in d and e to generate position code $C_\mu$.

5. The method of claim 1, wherein the estimated density of a position is determined by a number of the plurality of unoccupied positions vis-à-vis a number of the plurality of occupied positions and adaptively switching between coding of the plurality of occupied positions and coding of the plurality of unoccupied positions further comprises:
   if the number of the plurality of unoccupied positions of the n positions of the vector (x) is less than a threshold, determining values of the plurality of unoccupied positions of the n positions of the vector (x) and generating codeword (c) from the values of the plurality of unoccupied positions, and
   otherwise, if the number of the plurality of unoccupied positions of the vector (x) is not less than the threshold, determining values of the plurality of occupied positions and generating codeword (C) from the values of the plurality of occupied positions.

6. The method of claim 5, wherein if the number of the plurality of unoccupied positions of the n positions of the vector (x) is less than the threshold, equal to $(m-1)/2$, determining values of the plurality of unoccupied positions further comprises:
   determining a plurality of pulse magnitudes $m_1, m_2, \ldots, m_v$ of the plurality of occupied positions;
   generating a plurality of unoccupied pulse positions $u'_k$ based on the plurality of pulse magnitudes; and
   encoding the plurality of magnitudes when $2 \cdot (v-1) > (m-1)$ by position encoding of $m-v$ unoccupied pulse positions located at $m-1$ locations to generate a code $C_\mu$ for the plurality of pulse magnitudes.

7. The method of claim 6, wherein encoding the plurality of pulse magnitudes of the plurality of unoccupied positions further comprises:
   generating a code $C_\mu$ for the plurality of magnitudes in accordance with $$C_\mu = \sum_{k=1}^{m-v} F'(u'_k, k) \ 0 \leq u'_k < m-1,$$

where $\mu'_k$ belongs to a set U' defined as $U' = \{0, 1, \ldots, m-2\} - \{p'_1, p'_2, \ldots, p'_{v-1}\}$ and $$p'_k = \sum_{j=1}^{k} m_j - 1$$

8. The method of claim 7, wherein the code $C_\pi$ for the plurality of unoccupied positions is generated in accordance with $$C_\pi = \sum_{k=1}^{n-v} F'(u_k, k) \ 0 \le u_k < n$$

9. The method of claim 5, wherein determining a plurality of non-zero pulse positions $p_1, p_2, \ldots, p_v$ within the vector x comprises:
  selectively encoding the plurality of unoccupied positions to generate a code $C_\pi$ for the plurality of unoccupied positions in accordance with $$C_\pi = \sum_{k=1}^{n-v} F'(u_k, k) \ 0 \le u_k < n$$

10. The method of claim 5, wherein if the number of the plurality of unoccupied positions of the n positions of the vector (x) is not less than the threshold, equal to (m−1)/2, determining values of the plurality of occupied positions and generating codeword (C) from the values of the plurality of occupied positions further comprises:
  determining a plurality of pulse magnitudes $m_1, m_2, \ldots, m_v$ of the plurality of occupied positions when $2 \cdot (v-1) \le m-1$ to generate code $C_\mu$ for the pulse magnitudes in accordance with $$C_\mu = \sum_{k=1}^{v-1} F'\left(\sum_{j=1}^{k} m_j - 1, k\right) \ 1 \le \sum_{j=1}^{k} m_j, m_k < m;$$

and
  generating the codeword C from at least the code $C_\mu$.

11. The method of claim 10, further comprising:
  encoding a plurality of pulse positions $p_1, p_2, \ldots, p_v$ of the plurality of occupied positions to generate code $C_\pi$ in accordance with $$C_\pi = \sum_{k=1}^{v} F'(p_k, k) \ 0 \le p_k < n.$$

12. The method of claim 5, wherein if the number of the plurality of unoccupied positions of the n positions of the vector (x) is not less than the threshold, determining values of the plurality of occupied positions and generating codeword (C) from the values of the plurality of occupied positions further comprises:
  encoding a plurality of pulse positions $p_1, p_2, \ldots, p_v$ of the plurality of occupied positions to generate code $C_\pi$ in accordance with $$C_\pi = \sum_{k=1}^{v} F'(p_k, k) \ 0 \le p_k < n.$$

13. An encoder, comprising:
  combinatorial coding circuitry operable to perform:
    receiving a vector (x) having n positions to be encoded;
    determining an estimated density of a plurality of occupied positions of the n positions of the vector (x);
    adaptively switching between coding of the plurality of occupied positions and coding of a plurality of unoccupied positions of the n positions in accordance with the estimated density of the plurality of occupied positions to generate a coded value.

14. The encoder of claim 13, wherein the estimated density of a position is determined by a number of the plurality of unoccupied positions vis-à-vis a number of the plurality of occupied positions and adaptively switching between coding of the plurality of occupied positions and coding of the plurality of unoccupied positions performed by the combinatorial coding circuitry further comprises:
  coding the plurality of unoccupied positions when a number of the plurality of unoccupied positions is less than a threshold value; and
  coding the plurality of occupied positions when a number of the plurality of unoccupied positions is not less than the threshold.

15. The encoder of claim 13, wherein determining the estimated density and adaptively switching between coding of the plurality of occupied positions and coding of the plurality of unoccupied positions based upon the estimated density is dynamically performed at a plurality of positions of the n positions of vector (x).

16. A method for operating a decoder that generates a vector (x) from a codeword (C), the method comprising:
  receiving the codeword (C) representing a signal coded using a sequence of pulses;
  determining an estimated density of a plurality of occupied positions of n positions of the vector (x) based on the codeword C; and
  adaptively switching between decoding of the plurality of occupied positions and decoding of a plurality of unoccupied positions of the vector x in accordance with the estimated density of the plurality of occupied positions to generate a decoded value.

17. The method of claim 16, wherein determining the estimated density and adaptively switching between decoding of the plurality of occupied positions and decoding of the plurality of unoccupied positions based upon the estimated density is dynamically performed at a plurality of positions of the n positions of vector (x).

18. The method of claim 17, further comprising:
  for the positions $p_k$ of the n positions:
    a. if $2 \cdot v > n$ decoding a highest unoccupied position as $F'(u_{n-v}, v)$ from code $C_\pi$ but if $2 \cdot v \le n$ then decoding the highest occupied position as $F'(p_v, v)$, wherein a last decoded position ($\rho$) is set to $p_v$ or $u_{n-v}$;
    b. calculating a number of occupied positions ($\eta$) and a number of unoccupied positions ($\epsilon$) which are less than the last decoded position ($\rho$);
    c. if $2 \cdot \eta \le \rho$ then obtaining a maximum occupied position $p_k$ less than $\rho$ and decoding the position as $F'(p_k, \eta)$, wherein the last decoded position is $\rho = p_k$;
    d. if $2 \cdot \eta > \rho$ then obtaining a maximum unoccupied position $u_k$ less than $\rho$ and decoding the position as $F'(u_k, \epsilon)$, wherein the last decoded position is $\rho = u_k$.
    e. repeating b, c, and d until $\eta$ or $\epsilon$ is equal to 0;
  decoding the plurality of occupied positions from the maximum occupied positions $p_k$ and the maximum unoccupied positions $u_k$ generated in a, b, c, d and e.

19. The method of claim 17, further comprising:
  determining a plurality of pulse magnitudes $m_1, m_2, \ldots, m_v$ of the plurality of occupied positions;
  determining the occupied positions $p'_1, p'_2, \ldots, p'_{v-1}$ and the unoccupied $u'_1, u'_2, \ldots, u'_{m-v}$, of the n positions of the vector (x) based upon the plurality of pulse magnitudes $m_1, m_2, \ldots, m_v$; and for the positions $p'_k$ of the n positions:

a. if $2 \cdot (v-1) > m-1$ decoding a highest unoccupied position as $F'(u'_{m-v}, v-1)$ code $C_\mu$ but if $2 \cdot (v-1) \leq m-1$ then decoding the highest occupied position as $F'(p'_v, v-1)$, wherein a last decoded position ($\rho'$) is set to $p'_v$ or $u'_{m-v}$;

b. calculating a number of occupied positions ($\eta'$) and a number of unoccupied positions ($\epsilon'$) which are less than the last decoded position ($\rho'$);

c. if $2 \cdot \eta' \leq \rho'$ then obtaining a maximum occupied position $p'_k$ less than $\rho'$ and decoding the position as $F'(p'_k, \eta')$, wherein the last decoded position is $\rho'=p'_k$;

d. if $2 \cdot \eta' > \rho'$ then obtaining a maximum unoccupied position $u'_k$ less than $\rho'$ and decoding the position as $F'(u'_k, \epsilon')$, wherein the last decoded position is $\rho'=u'_k$.

e. repeating b, c, and d until $\eta'$ or $\epsilon'$ is equal to 0;

decoding the plurality of occupied positions from the maximum occupied positions $p_k$ and the maximum unoccupied positions $u_k$ generated in a, b, c, d and e.

20. The method of claim 16, wherein the estimated density of a position is determined by a number of the plurality of unoccupied positions vis-à-vis the number of the plurality of occupied positions and adaptively switching between decoding of the plurality of occupied positions and decoding of the plurality of unoccupied positions further comprises:

if the number of the plurality of unoccupied positions of the n positions of the vector (x) is less than a threshold, decoding the plurality of unoccupied positions of the n positions of the vector (x) and decoding the plurality of occupied positions based upon the decoded plurality of unoccupied positions;

generating a plurality of decoded occupied position values from the plurality of unoccupied positions and generating vector (x) from the plurality of decoded unoccupied and decoded occupied position values, and otherwise, if the number of the plurality of unoccupied positions of the vector (x) is not less than the threshold, decoding the plurality of occupied positions.

21. The method of claim 20, wherein if the number of the plurality of unoccupied positions of the n positions of the vector (x) is less than the threshold, further comprising:

decoding a plurality of unoccupied pulse positions $u'_k$;

decoding a plurality of pulse magnitudes $m_1, m_2, \ldots, m_v$ of the plurality of occupied positions from the extracted code $C_\mu$ and the plurality of decoded unoccupied pulse positions $u'_k$; and decoding the codeword (C) using the decoded plurality of pulse magnitudes $m_1, m_2, \ldots, m_v$ of the plurality of occupied positions to generate the vector (x) in accordance with $x_{p_k} = m_k s_k$.

22. The method of claim 20, wherein if the number of the plurality of unoccupied positions of the n positions of the vector (x) is less than the threshold, further comprising:

decoding a plurality of unoccupied pulse positions $u_k$;

generating a plurality of decoded occupied pulse positions from the plurality of decoded unoccupied pulse positions $u_k$;

decoding the codeword (C) using the decoded unoccupied pulse positions and the decoded occupied pulse positions to generate the vector (x).

23. A decoder comprising:

combinatorial decoding circuitry operable to perform:

receiving the codeword (C) representing a signal coded using a sequence of pulses;

determining an estimated density of a plurality of occupied positions of n positions of the vector (x) based on the codeword C; and adaptively switching between decoding of the plurality of occupied positions and decoding of a plurality of unoccupied positions of the vector x in accordance with the estimated density of the plurality of occupied positions to generate a decoded value.

24. The decoder of claim 23, wherein the estimated density of a position is determined by a number of the plurality of unoccupied positions vis-à-vis the number of the plurality of occupied positions and adaptively switching between decoding of the plurality of occupied positions and decoding of the plurality of unoccupied positions performed by the combinatorial decoding circuitry further comprises:

decoding the plurality of unoccupied positions to generate a plurality of decoded unoccupied positions and generating a plurality of decoded occupied positions from the plurality of decoded unoccupied positions when the number of the plurality of unoccupied positions is less than a threshold value; and decoding the plurality of occupied positions when the number of the plurality of unoccupied positions is not less than the threshold.

25. The decoder of claim 23, wherein determining the estimated density and adaptively switching between decoding of the plurality of occupied positions and decoding of the plurality of unoccupied positions based upon the estimated density is dynamically performed at a plurality of positions of the n positions of vector (x).

* * * * *